United States Patent
Wang et al.

(10) Patent No.: US 11,474,131 B2
(45) Date of Patent: Oct. 18, 2022

(54) REMOVING PERTURBATION SIGNAL FROM A SERIAL DATA STREAM, AND TO MEASUREMENT AND/OR PROTECTION APPARATUS INCLUDING SAME

(71) Applicant: Analog Devices International Unlimited Company, Limerick (IE)

(72) Inventors: Long Wang, Beijing (CN); William Michael James Holland, Edinburgh (GB); Seyed Amir Ali Danesh, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 188 days.

(21) Appl. No.: 16/569,361

(22) Filed: Sep. 12, 2019

(65) Prior Publication Data
US 2020/0096545 A1 Mar. 26, 2020

(51) Int. Cl.
*G01R 19/25* (2006.01)
(52) U.S. Cl.
CPC .................. *G01R 19/25* (2013.01)
(58) Field of Classification Search
CPC ...................................... G01R 19/25
USPC ...................................... 702/64
See application file for complete search history.

(56) References Cited

U.S. PATENT DOCUMENTS

| 6,696,843 B1 | 2/2004 | Beneteau et al. |
| 8,665,128 B2 * | 3/2014 | Silva .................. G06J 1/00 341/143 |
| 9,054,733 B2 * | 6/2015 | Quiquempoix ....... H03M 3/368 |
| 2012/0001617 A1 | 1/2012 | Reynolds |
| 2015/0355248 A1 | 12/2015 | Dionne |

FOREIGN PATENT DOCUMENTS

| CN | 101500254 A | 8/2009 |
| CN | 206004666 U | 3/2017 |
| CN | 110940846 | 3/2020 |
| WO | 2013038176 | 3/2013 |
| WO | 2014072733 | 5/2014 |
| WO | 2014191776 | 12/2014 |
| WO | 2017129807 | 8/2017 |

OTHER PUBLICATIONS

"European Application Serial No. 19198682.7, Extended European Search Report dated Feb. 17, 2020", 10 pgs.
"Chinese Application Serial No. 201910892768.7, Office Action dated Aug. 4, 2021", w/English translation, 16 pgs.

* cited by examiner

*Primary Examiner* — Ricky Go
(74) *Attorney, Agent, or Firm* — Schwegman Lundberg & Woessner, P.A.

(57) ABSTRACT

An apparatus is provided which substantially removes a perturbation signal from a pulse density modulated signal representing a combination of a signal to be measured and a perturbation applied to the signal to be measured. The removal of the perturbation is done by subtracting a correcting signal from the pulse density modulated signal. This approach introduces very little delay as it can be implemented by simple logic gates. It also provided enhanced immunity from the effects of bit errors.

20 Claims, 21 Drawing Sheets

+

⇓

REMOVING PERTURBATION SIGNAL FROM A SERIAL DATA STREAM, AND TO MEASUREMENT AND/OR PROTECTION APPARATUS INCLUDING SAME

CLAIM OF PRIORITY

This is a continuation application of PCT Application No. PCT/CN2018/107082, filed on Sep. 21, 2019, which is herein incorporated by reference in its entirety.

FIELD

The present disclosure relates to a method of and an apparatus for removing a perturbation signal from a bit stream, where the bit stream represents a digitized version of a combination of an analog signal to be measured and a perturbation applied to that analog signal. It also relates to measurement and/or protection apparatus including the apparatus for removing the perturbation signal from the bit stream.

BACKGROUND

It is desirable to measure parameters, such as voltages or currents with a guaranteed degree of accuracy. Current shunts or potential dividers can provide a high degree of accuracy, for example 1% accuracy or better, over a prolonged period of time and a wide range of temperature and other environmental conditions can be prohibitively expensive. For example, in the context of an electricity meter, the current shunt used therein has to have a specified resistance and maintain that resistance to within 1% or better over a working lifetime of perhaps 10 or 20 years over a wide range of temperatures, and in the presence of moisture.

SUMMARY

Techniques and measurement systems in which a specified perturbing current or voltage is supplied can enable the transfer function of a current transducer or potential divider to be monitored with great accuracy. Furthermore, this monitoring can be performed in situ and while the current transducer or the potential divider is in use. Examples of certain approaches to such systems are described in WO 2013/038176, WO2014/072733 and WO 2014/191776.

In some instances the monitoring of the current or a voltage (or both) is performed as part of a protection arrangement. In those circumstances it is desired that out of bound currents or voltages can be detected quickly and remedial action taken in order to reduce potential damage to systems, or even loss of life.

In protection systems it is still desirable to know the transfer function of the current transducer and/or of a potential divider. Consequently it is appropriate to apply a specified perturbing signal to characterize the transfer function of the protection system.

It would be desirable for such protective and monitoring functions to work with reduced (and preferably minimized) latency. The protection circuits should work with the digital output of an analog to digital converter, and in particular high data rate low bus width converters, such as sigma delta analog to digital converters.

Furthermore, in protection systems it is highly desirable that data processing performed by the system is substantially immune to bit errors.

The present disclosure provides an apparatus for removing a perturbation signal from a first bit stream. The first bit stream represents the digitized value of an input signal that comprises an analog value to be measured (a measurand) and a perturbation value that is added to or superimposed on the analog value to be measured. The perturbation value is a specified size in the analog domain but its contribution to the first bit stream is unknown.

Knowledge of the size and timing of the perturbation value allows the transfer function of a transducer measuring the measurand to be determined. It also enables the performance of a signal processing chain to be monitored, for example in terms of the gain it applies or the phase shift through an analog signal processing chain acting on the output of the transducer. The analog signal from the transducer and the processing chain is then converted from the analog domain to the digital domain. Typically in instrumentation systems the analog digital converter is a sigma-delta modulator. A sigma-delta modulator produces a pulse density modulated version of the analog signal at its input. In its simplest form a sigma delta modulator produces a single stream of serial data at a high data rate. Such data rates are typically in the region of 1 million bits per second. However multi-level quantizers can also be provided within sigma delta modulators and hence the output from such modulators is not restricted to be a single channel of bits, and may be a bit stream of several bits wide, for example two or three bits. As used herein, the term "bit stream" refers to high data rate low width words as output by delta-sigma devices, and contrasted with higher resolution words as output by successive approximation routine converters.

Working on the bit stream output of the analog to digital converter directly, rather than working with a multi-bit word derived from the bit stream, e.g. a 24 bit wide word at a lower data rate) brings some challenges within the data processing path. However the inventors realized that working directly on the bit stream provides a significant reliability improvement for time critical responses in an electrically noisy environment. This point will be discussed more fully later. However for the time being it is sufficient to note that in an electrically noisy environment there is always a possibility that noise may result in a bit being flipped such that a bit transmitted as a '1' is received as a '0' or vice versa.

In a bit stream signal, all the bits have equal weight, and if a single bit is flipped, then the percentage error that this introduces is small. However, in a wide data word if the bit error occurs on one of the more significant bits, then the percentage error can be massive. Whilst error coding techniques can be employed to allow corruption in a word to be identified, this can result in an increase in the time required to transmit the data word over, for example, a serial data link and may also require the word to be retransmitted. This can introduce a significant delay.

In an embodiment of this disclosure the apparatus comprises a first path where the output of the sigma delta modulator is provided to a digital processing circuit, and the output of the digital processing circuit represents the bit stream as if the perturbation signal had not been applied. A first perturbation signal processing arrangement is adapted to search for the perturbation signal, for example within the first bit stream, in order to identify it and parameterize it such that an idealized version of the perturbation signal can be created and provided to the digital processing circuit so as to, for example, form a difference between the first bit stream and the idealized version of the perturbation signal.

The inventors realized that they could exploit the fact that the perturbation signal does not need to be processed in real time in order to provide a quick and efficient mechanism for extracting the perturbation signal. Furthermore this enables the perturbation signal to be extracted from the pulse train output of the sigma delta modulator.

A replica of perturbation signal can be formed as a second bit stream and the second bit stream can be digitally subtracted from the first bit stream to leave a third bit stream which represents what the output of the sigma-delta modulator would have been had the perturbation signal not been applied. Alternatively a counter-acting signal (effectively an inverse of the perturbation signal) can be formed and added to the first bit stream.

In other embodiments the first perturbation signal processor or a further data processor could be arranged to monitor the third bit stream or down converted data words derived therefrom to look for residual components of the perturbation signal, and use this to refine the generation of the replica perturbation signal. The approaches of examining the first bit stream to identify the perturbation signal and examining the third bit stream or signals derived from the third bit stream to identify the residue of the perturbation signal can be used together.

The teachings of this disclosure can be extended to remove unwanted signals from a bit stream, where the unwanted signal is repeating such that the approximations of the unwanted signal can be generated and converted to form, for example, the second bit stream. In such an arrangement the frequencies within the unwanted signal do not need to be unchanging, but should change slowly enough for the first perturbation signal processor to adapt its estimate of the unwanted signal so as to form a sufficiently accurate second bit stream to enable the third bit stream to have the unwanted signals attenuated therein to an acceptable amount.

Where the perturbation signal is a current it can be referred to as a perturbation current or a measurement current. Similarly where the perturbation signal is a voltage it can be referred to as a perturbation voltage or a measurement voltage.

According to a second aspect of this disclosure there is provided a measurement device or a protective device including an apparatus in accordance with the first aspect of this disclosure.

The protective device may be a circuit breaker. The protective device may be arranged to assume an "open circuit" condition in response to an overvoltage condition, an under voltage condition or an over current condition.

The present disclosure further provides a method for processing a bit stream so as to remove a perturbation or other unwanted signal therefrom, the method comprising:
receiving a first bit stream signal;
forming a second bit stream signal representing a perturbation signal or an unwanted signal that it is desired to remove or attenuate in the first bit stream, and processing the first and second bit streams to form a third bit stream where the perturbation or unwanted signal component is suppressed or attenuated.

BRIEF DESCRIPTION OF THE DRAWINGS

Embodiments of the present disclosure will now be described, by way of non-limiting example only, with reference to the accompanying drawings, in which.

DESCRIPTION OF SOME EMBODIMENTS OF THE PRESENT DISCLOSURE

The techniques described herein to remove a perturbation signal, where the perturbation signal had been introduced to allow a transfer function to be characterized, can be applied to metering and to monitoring/protection systems. Initially we shall describe the use of a perturbation signal in the context of a metering system.

Figure 1:
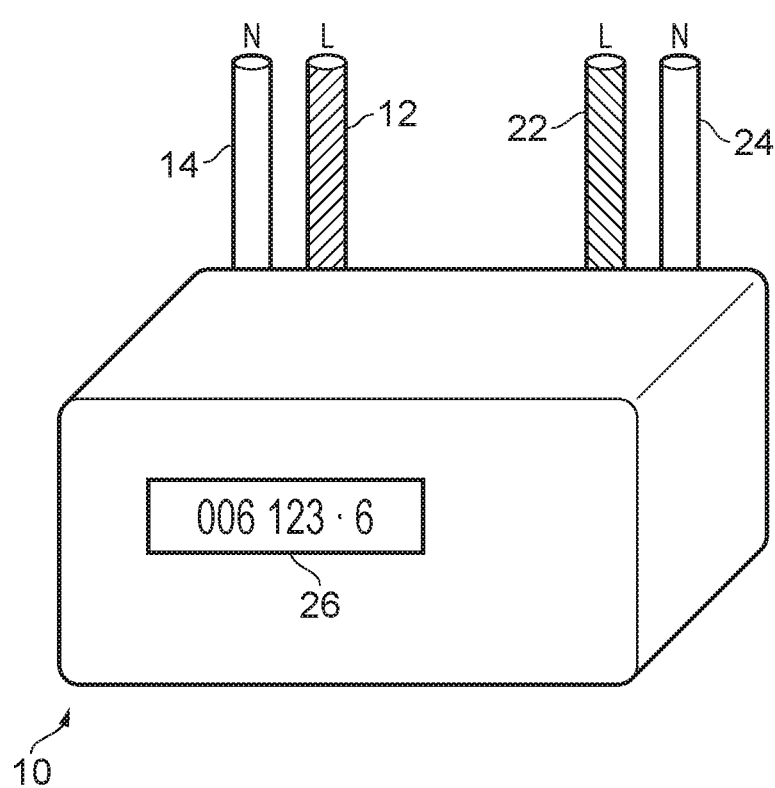
FIG. 1 is a perspective view of an electricity consumption meter.

FIG. 1 is a perspective view of an electronic electricity meter constituting an embodiment of the present disclosure. The meter, generally designated 10 has live and neutral conductors 12 and 14 connecting the meter 10 to an electricity supply, such as a country's national grid or a local generation system. Further live and neutral conductors 22 and 24 extend from the meter towards a load, for example a domestic dwelling, a factory a data center, a charging station, street furniture, an appliance and so on. The meter 10 is operative to measure the current flowing between the electricity supply and the load. The amount of current being drawn by the load may be displayed on a display 26 or sent back to a monitoring station elsewhere by way of a suitable communications interface 27, such as wireless modem or a wired interface or even powerline communication. Typically electricity suppliers are interested in the amount of energy consumed by a user. Therefore generally the meter 10 also measures the supply voltage between the conductors 12 and 14 and uses this to calculate the instantaneous power being consumed by a user. The instantaneous power in a given period is summed with a preceding estimate of total energy consumed and the meter displays a running total of the energy consumed by a user, generally in the form of kilowatt, kW, hours. The running total of kW hours is typically displayed on a display 26 on the meter 10. The meter may also measure power being returned to the supply. This data can be transmitted by a suitable communications scheme to a monitoring and/or billing entity.

Figure 2:
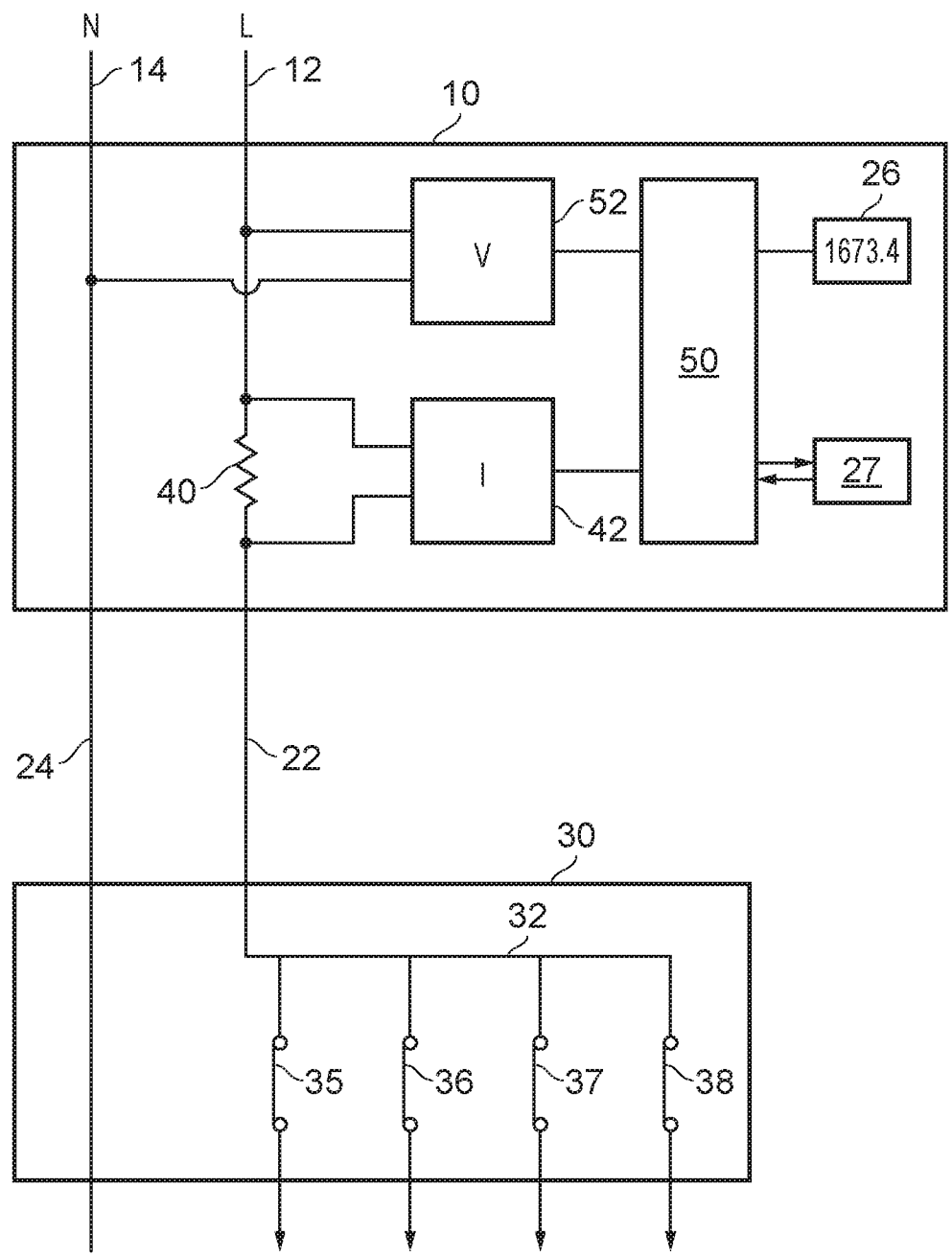
FIG. 2 shows the functional blocks of the meter of FIG. 1 in greater detail.

FIG. 2 schematically illustrates the meter 10 being placed in a domestic dwelling so as to monitor the live current passing between the conductors 12 and 22, representing a distribution side "live" and a load side "live", respectively. The current passing through the meter is generally then provided to a distribution block 30 containing a bus bar 32 connecting with a multiple switches, fuses or circuit breakers, 35, 36, 37 and 38 which provide current flow paths to respective loads, such as a ring main, a lighting circuit, a shower and a cooker within a domestic dwelling.

The meter 10 comprises a current measurement channel 42 having a current measuring transducer 40. Various current transducers are available for use in measuring currents. A current shunt, i.e. a resistance inserted into the current flow path, provides for indirect measurement of current by converting the current flow to a voltage measured across the shunt.

Typical applications of current shunts include over current protection as well as in metering of electricity consumption. In use, a shunt of specified resistance is provided in the current flow path. The voltage across the shunt is proportional to the current flowing in the shunt and to the resistance of the shunt.

In a protective system the value of the current or the voltage is compared with a predetermined threshold, and if the value exceeds the predetermined threshold then an action is taken.

The action may be the operation of an associated electromechanical switch such that the current flow in the conductor 12 can be inhibited. This action may be undertaken unilaterally. Alternatively, depending on the severity of the overcurrent excursion a message may be sent to a control center with a request for an instruction about maintaining or disconnecting the supply to be issued. The protective system may also measure the voltage to detect over voltage and under voltage conditions and the action that gets taken may be dependent on both the measured current and the measured voltage.

In the event of an excess current flow that could damage components it is desirable to detect the excess current accurately and quickly such that a remedial action can be taken without delay.

In order for the current measurement to be accurate (be that for metering or for use in protection systems), the resistance of the shunt needs to be known to at least the desired accuracy. Furthermore, steps must be taken to ensure that self-heating of the shunt does not degrade the measurement accuracy. For modest or large currents the shunt needs to be of very low resistance. Furthermore the resistance of the shunt must not change over time, for example due to corrosion, self-heating, overvoltage effects, thermal cycling or other environmental conditions.

An alternative to use of the current shunt is the use of a current transformer or similar induction based sensor, such as a Rogowski coil. A disadvantage of such current transformers or Rogowski coils is that they cannot be used to measure DC currents. A further disadvantage of the Rogowski coil is that the output from such a device for a given magnitude of current increases proportionally to the frequency of the current. This may mean that, unless steps are taken to address this, the contribution from harmonic components in the current may be overstated. However an advantage of such an inductive sensor is that it remains isolated from the current carrying conductor thereby giving greater operational safety and even allowing for the device to be retrofitted around an operational conductor. The current induced in a current transformer by virtue of current flowing through a conductor that is being measured is converted into a voltage by use of a burden resistor. Accurate determination of the current flowing in the conductor that is being measured requires knowledge of the transfer function of the current transformer and the burden resistors. For a Rogowski coil a burden resistor is not required.

Other magnetic sensors are possible, such as Hall effect devices, magneto-resistive sensors and so on. It would be advantageous to provide an apparatus that could reliably monitor a current transducer and to indicate whether the transfer function of the current transducer has changed over time. The apparatus and techniques described herein is suitable for use with any such current transducer. However, for simplicity, the embodiments described herein will focus primarily on the use of shunts for measuring currents. It should be noted that the techniques described here are suitable to be applied to any transducer and measurement system.

Returning to the meter 10 shown in FIG. 2 it has, in this example, a shunt 40 in the path of the live conductor 12, and a processing circuit 42 for receiving the voltage developed across the shunt 40 and providing a current signal to a data processor 50. The meter 10 also comprises a voltage channel wherein a voltage measuring circuit 52 measures the voltage between the live and neutral conductors and provides an estimate of the voltage to the data processor 50. It should be noted that meters can also implement a local protection function, for example to perform disconnects of the supply using a relay (not shown) in the event of over current events or earth leakage events.

The circuits 42 and 52 of the current and voltage channels, be they in a meter or a protection device, may each include filters for filtering out spurious noise or other out of band interference. The circuits 42 and 52 may also include variable gain amplifiers operative to change the gain therein in response to signals from the data processor 50. The channels may also include respective analog to digital converters or may share an analog to digital converter between them. The filters in circuits, such as anti-aliasing filters or other components therein (for example an integrator if the current sensor is a Rogowski coil) may introduce phase or time shifts in the processing of the signals. The circuits 42 and 52 may also therefore include temporal alignment devices such as shift registers or other forms of memory to ensure that an instantaneous voltage measurement is time aligned with the corresponding instantaneous current measurement.

Figure 3:
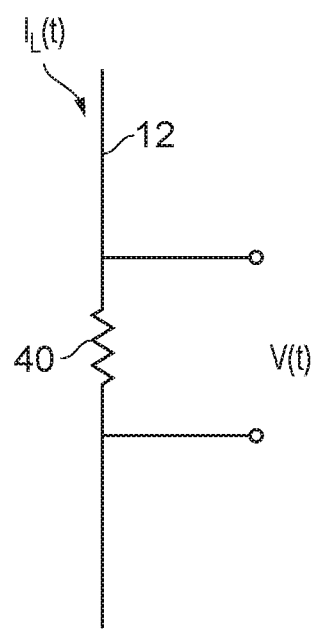
FIG. 3 is a circuit diagram of the current shunt for transforming a current passing through the shunt to a voltage occurring across the shunt.

FIG. 3 shows part of embodiment of the current measuring channel 42 in greater detail. A shunt resistor 40 is provided in a conductor 12 which carries a current $I_L(t)$ from a supply to a load. The load current $I_L(t)$ may be a direct current or an alternating current. The current flowing through the shunt resistor 40 is converted to a voltage V(t) representing a current flow in the conductor 12. The voltage V(t) is related to the current $I_L(t)$ by:

$$V(t)=I_L(t)*R_S \qquad \text{Equation 1}$$

where:
$I_L(t)$=load current
V(t)=voltage across the shunt resistor
$R_S$=resistance of the shunt resistor.

Electricity consumption meters often require the measurement of the power consumed to be measured to better than 1% or 2%. This means that the resistance of the shunt resistor 40 also needs to be known to at least that accuracy, and indeed more to allow for the compounding of errors resulting from inaccuracy in a voltage channel, quantization error and the like to still fall within the permissible limits of, for example, 1% accuracy or better.

Where it is desired to measure large currents, for example in the tens or hundreds of amps if not more, then the resistance of the resistor has to be very low in order that $I^2R$ heating of the resistor 40 does not damage it. As a consequence, it can be difficult to accurately manufacture such a low value resistor, and especially one which has to be stable over a prolonged period of time and temperature range, and be resistant to humidity.

The resistance of the shunt resistor 40 may be determined by a factory calibration during construction of the meter 10 or other circuit employing it. Nevertheless, this does not guarantee that the resistance of the resistor 40 does not change over its lifetime. As an alternative the manufacturer of an electricity meter may not wish to have to undergo calibration at manufacture, and such calibration may either be done later or in-situ In order to determine the resistance of the shunt resistor 40, either as part of an initial calibration procedure or to confirm that the shunt resistance has not changed over time following an initial factory calibration, it is desirable to pass a specified current through the shunt. However, taking the electricity meter or protection circuit out of the distribution circuit to isolate it such that a specified current can be passed is not appropriate, and often not possible.

However the present applicant has already described an approach where a specified perturbation signal $M_f(t)$ is also passed through the current measurement transducer such that the output of the transducer results from the superposition of the responses from the specified signal $M_f(t)$ and the unknown load current $I_L(t)$.

Figure 4:
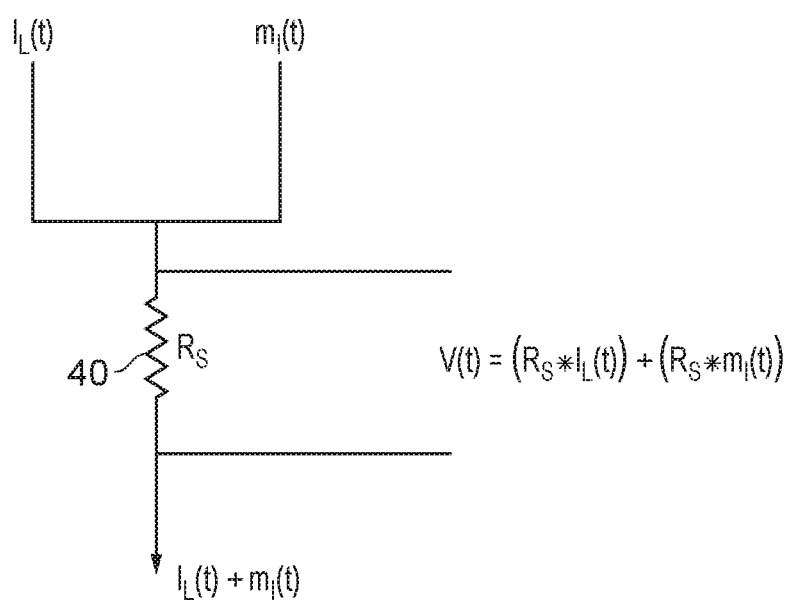
FIG. 4 shows the same current shunt as FIG. 3, but when an additional specified time varying perturbation M(t) is applied to the current passing through the shunt.

Thus, in the case of a current measuring transducer comprising the current shunt 40, both currents must pass thought the shunt 40. Assuming the shunt has a resistance Rs, then, as shown in FIG. 4, the voltage V(t) across the shunt is:

$$V_S(t)=Rs*I_L(t)+Rs*M_f(t) \qquad \text{Equation 2}$$

Figure 5A:
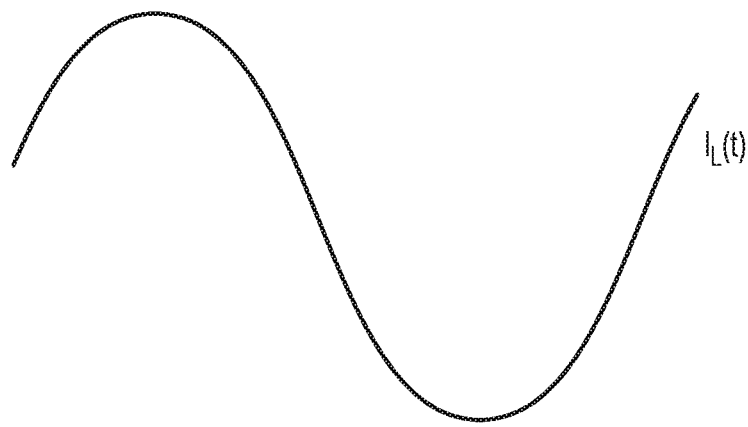
FIG. 5A-C schematically illustrates the current wave forms I(t) and M(t) together with the consequence of the super position V(t)
Figure 5B:
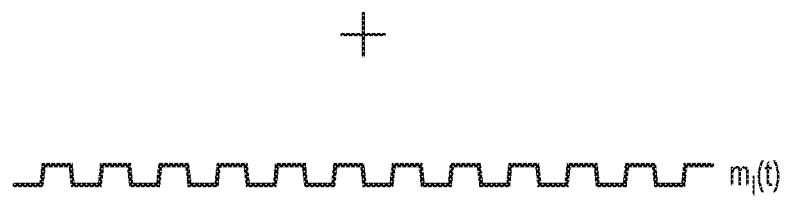
Figure 5C:
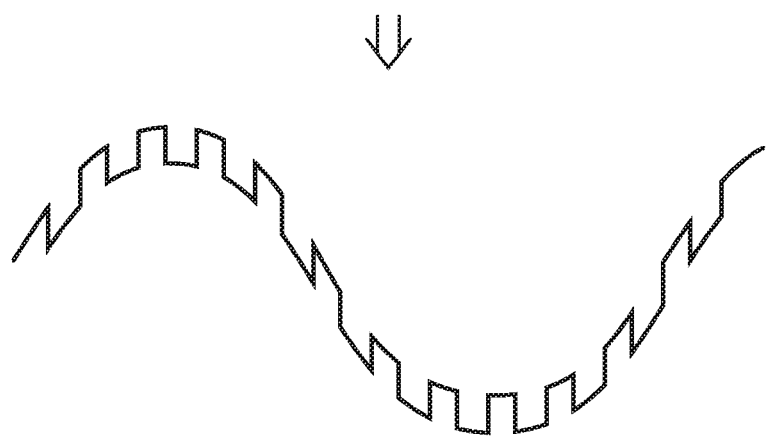

If we assume that $I_L(t)$ is substantially sinusoidal, as shown in FIG. 5a, and that $M_f(t)$ is a square-wave like signal (for example with slew rate limited transitions between first and second values) as shown in FIG. 5b, then a composite output voltage across the resistor might look like the waveform shown in FIG. 5c. The magnitude of the perturbation $M_f(t)$ and its effect of the composite signal have been greatly exaggerated for ease illustrating the summation of the signals.

Figure 6:
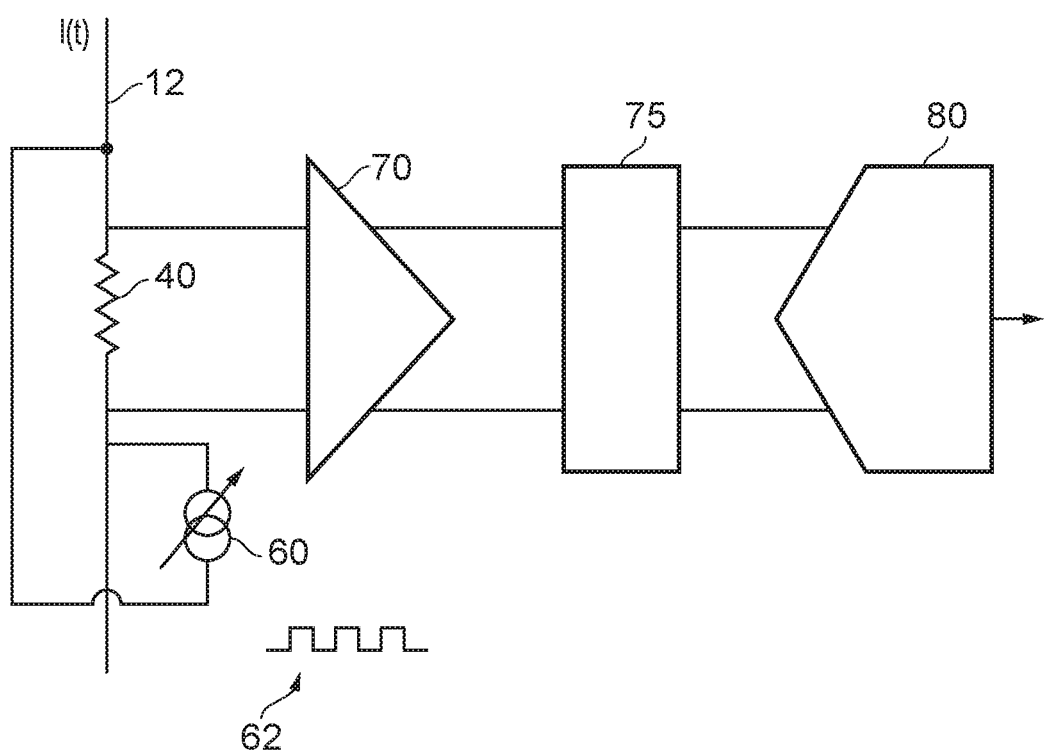
FIG. 6 schematically illustrates a circuit for measuring the current flowing through the shunt and for adding the load perturbation signal.

FIG. 6 schematically illustrates, in simplified form, a circuit for measuring load current where the load current $I_L(t)$ passes through the resistor 40 and an additional current source 60 draws a variable current, as schematically illustrated by current versus time function 62 so as to add a perturbation current $M_f(t)$ to the load current $I_L(t)$. The voltage across resistor 40 is provided to a differential amplifier 70 which amplifies it before outputting a differential signal by way of an anti-aliasing filter 75 to a differential analog to digital converter 80.

Figure 7:
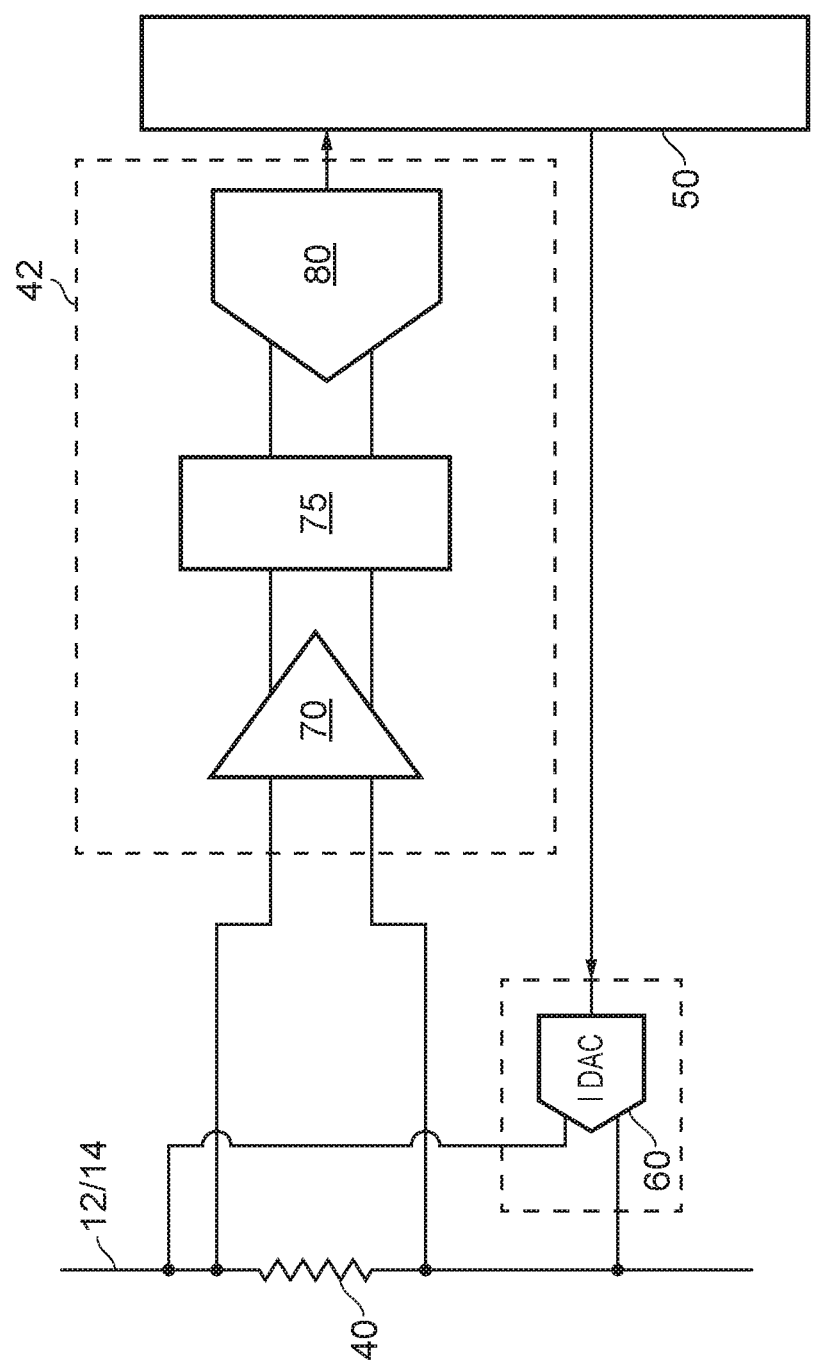
FIG. 7 schematically illustrates an embodiment of a current measuring circuit with a perturbation generator.

FIG. 7 shows a further embodiment of a current measuring apparatus where the components of FIG. 6 are shown in the context of the circuit shown in FIG. 2. A circuit 60 comprising a current DAC is provided for generating a specified time varying current $M_f(t)$ which can be applied to the shunt resistor 40 in order to measure its resistance. Therefore, the voltage at the input of the processing circuit 42 comprises the sum of the load current $I_L(t)$ passing through the shunt and the measurement current $M_f(t)$. If the measurement current $M_f(t)$ varies as a function of time in a specified manner, whether that be predetermined or measured, then the voltage component resulting solely from the flow of the measurement current $M_f(t)$ can be extracted. Provided that the measurement current $M_f(t)$ is known to sufficient accuracy, then the transfer function (in this example the resistance) of the shunt can also be determined, and similarly the transfer function of the signal processing circuits acting on the voltage from the shunt can also be determined.

The current $M_f(t)$ may be generated by any suitable current generation apparatus.

Generally the measurement current $M_f(t)$ is much smaller than the load current $I_L$. For example, the load current may be expected to fall within the range of 0 to 100 Amps. However the measurement current will typically only be in the range of mA. Therefore it can be seen that the varying signal resulting from the time varying measurement current is much smaller compared to the instantaneous load current signal.

The voltage across the shunt resistor (or the burden resistor of a current transformer) is amplified by an amplifier 70 and then passed through an anti-aliasing filter 75 before being digitized by an ADC 80, which could be a sigma-delta modulator.

For the purpose of the remainder of this disclosure we will assume that the analog to digital converter 80 is implemented in the form of a sigma delta modulator. The output of the sigma delta modulator is a high data rate bit stream, sometimes only 1 bit wide, but potentially 2, 3 or more bits wide.

Figure 8:
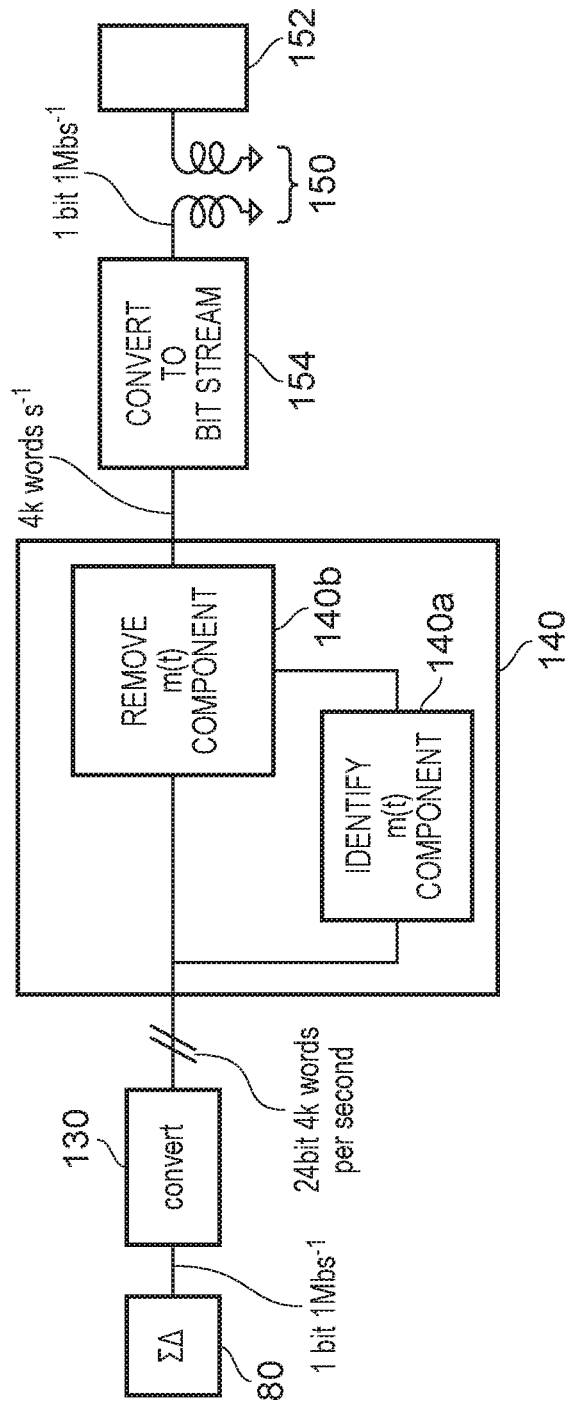
FIG. 8 shows an example of a signal processing circuit that can remove the contribution of the perturbation current.

The bit stream effectively represents a pulse density modulated version of the input. Typically and as shown in FIG. 8, the person skilled in the art would process the bit stream from the ADC 80, optimally by filtering it, and then decimating it at converter 130 in order to convert the bit stream from a high rate low width bit stream to a low rate high resolution data word. Thus, the converting process, which is performed by the converter 130 gives rise to a relatively high resolution conversion word, for example 24 bits, give or take a few bits, at a relatively low bit update rate, for example 4000 words per second compared to the, say, 1 million bits per second from the output of the sigma delta modulator 80. By its very nature the converter 130 has to operate on a large number of bits sequentially, and hence the conversion introduces a time delay. Put another way, if there was suddenly a massive over current event, it might take one or two convert cycles for that to become apparent. This could introduce a delay in the order of half a millisecond or so. Additional filtering and signal processing may need several of the words before giving a valid output, thereby introducing further delay.

Although the perturbation component is small, there may be a desire to remove it, for example such that end users of the data provided by such a system can be effectively agnostic to the presence of the perturbation signal. As a result the words output by the converter 130 may be sent to a processor 140 which analyses the sequence of high resolution but low update rate data words to identify the voltage change resulting from perturbation components. Effectively this can be identified by a low pass filtering at process 140a the high resolution words to identify the perturbation signal component in terms of magnitude and phase shift and then a new series of words representing that perturbation is used to modify the words (at process 140b) output from the data converter 130. This identification and extraction of the perturbation component may itself take some time, being that it is performed on a constantly updating data set, and hence a further delay in the order of milliseconds or more may be introduced if working on the high resolution words to filter out the perturbation.

The output of the processor 140 is in the form of relatively wide words of a relatively low data rate (24 bits at 4000 words per second in this example).

The words typically have to be transmitted across an isolation barrier 150 to an application processor 152 that performs one or more tasks on the data.

The isolation barrier 150 can be of any suitable technology. The isolation barrier may be an inductive coupler such as a transformer or magneto-resistors responsive to a magnetic field induced by a signal flowing in a coil. Capacitive or optical couplers can also be used.

The transmission of data from the processor 140 to the application processor 152 needs to be robust against bit errors. It would be possible to encode the words with an error correction code, but the overhead in identifying and recovering from one or more bit errors can be significant. For this reason the multi-bit words are re-encoded (or up-converted) to a bit stream by a second converter 154. This is effectively another bout of sigma-delta modulation, and since the input is a digital word, the sigma-delta modulation can be implemented wholly within a digital data processor.

Thus, with the bit rate modified from 24×4000=96000 bits per second to a desired bit stream rate, possibly back up to 1000000 bits per second, but the effect of any single bit error is significantly reduced. However the re-conversion to a bit stream introduces a further delay.

However, if the wide low data rate words are not re-modulated into a pulse-density bit stream (or a pulse width bit stream) then any bit error is likely to be handled by an error check routine having to send a request back over the isolation barrier for the word to be resent.

The inventors realized that the periodic nature of the perturbation signal could be leveraged in order to parameterize it and then reconstruct it in order to remove the perturbation signal at the bit stream level, i.e. at the data rate output from the sigma delta converter 80 thereby providing for near instantaneous removal of the perturbation signal and avoiding the need for conversion of the bit stream signal to different data rates.

Figure 9:
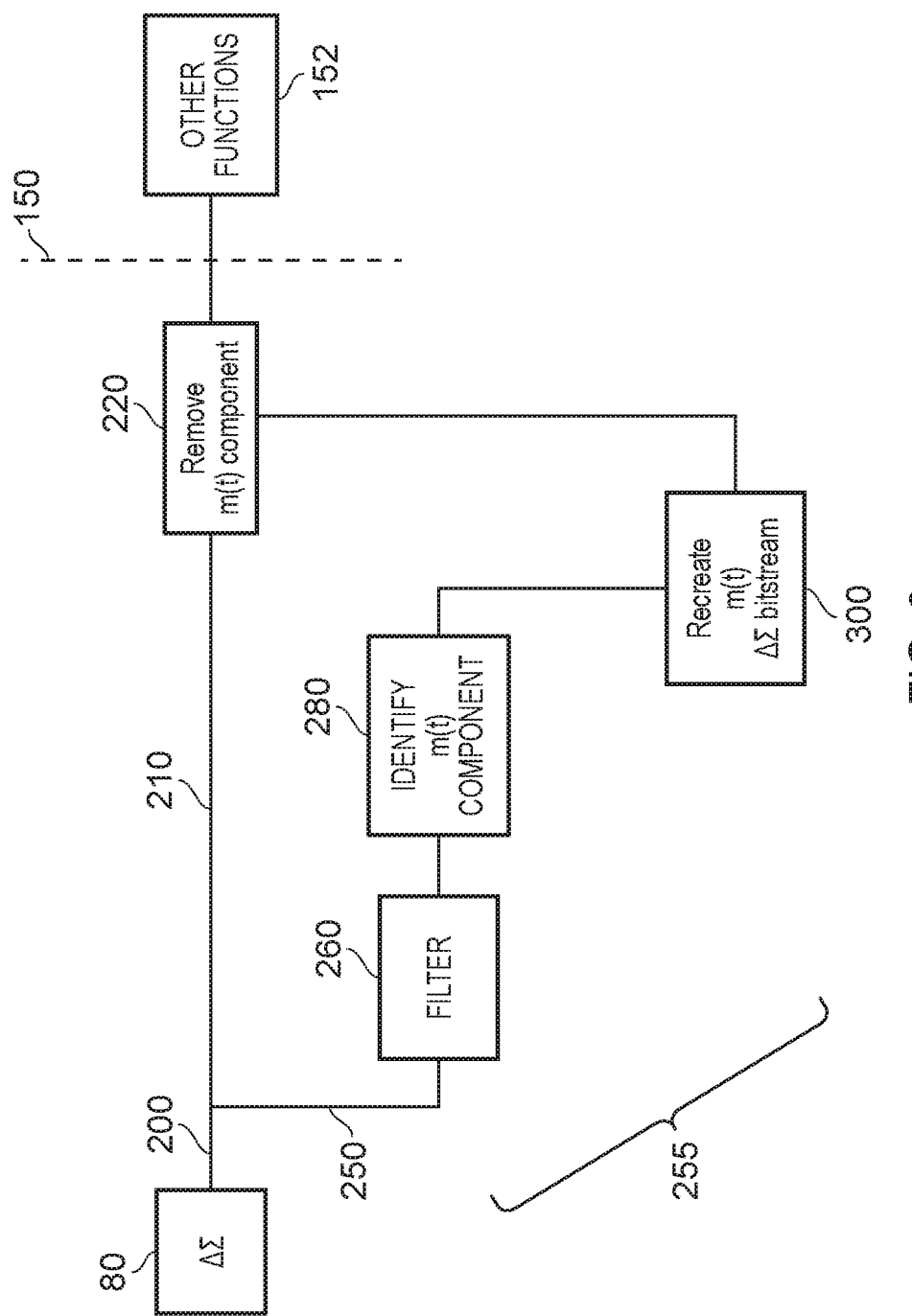
FIG. 9 shows a signal processing circuit in accordance with the teachings of this disclosure.

An embodiment of a circuit in accordance with the teachings of this disclosure is shown in FIG. 9. Here the delta-sigma ADC modulator 80 outputs a first bit stream. The first bit stream 200 represents the converted value of the load current $I_L(t)$ and any measurement perturbation signal $M_f(t)$. The first bit stream is directed along first and second paths.

A first path 210 takes the first bit stream 200 to an input of a digital processing circuit 220, which in this example is a differencer.

A second path 250 takes the first bit stream to a perturbation signal processing circuit 255 where the first bit stream is filtered by filter 260, and optionally decimated, to convert it from a high bit rate low data width signal to a lower data rate higher resolution word.

The high resolution word can then be provided to a processor 280 which identifies the signal component $M_f(t)$, for example by using correlation based analysis (since the signal driving the DAC 60 of FIG. 7 is known), by frequency domain analysis or any other suitable technique or combination of techniques.

Once the component of $M_f(t)$ has been identified it can be described in terms of frequency content, magnitude, mark-space ratio, slew rate and the like, to generate an idealized version of $M_f(t)$ which can then be processed to recreate a delta-sigma bit stream representing only $M_f(t)$ by a reconstruction processor 300. The reconstruction processor 300 could involve a physical DAC, filter and delta-sigma modulator to recreate the bit stream, or the bit stream could be regenerated purely by a suitably implemented digital processor.

The output of the reconstruction processor 300 can be regarded as being a second bit stream, and this is provided to a second input of the digital differencer 220.

The digital differencer 220 forms a third bit stream as a difference between the first and second bit streams. The third bit stream needs to be able to encode both the magnitude of the bit by bit differencing as well as the sign of the difference. The third bit stream can then be passed over an isolation barrier 150 (if one is provided) to the application processor 152.

The filter 260, bit stream regenerator 300 and digital processing circuit (differencer) 220 may be implemented by dedicated hardware. The perturbation identification system 280 could also be implemented in hardware, for example by a fast Fourier transform circuit, but advantageously is implemented using a programmable processor or a digital signal processor. As 1 Mbs is relatively modest compared to the operational rates of digital signal processors and microprocessors then, if desired, one or more of the filter 260, bit stream regenerator 300 and digital differencer 220 may be implemented using a microprocessor or a digital signal processor and appropriate program code.

The operation of the bit stream digital processor/digital differencer 220 will now be discussed further with respect to FIGS. 10a to 10c.

Suppose that the output of the delta-sigma modulator is a single bit stream as shown in FIG. 10a. Suppose also that the processor 300 has recreated the second bit stream that represents the delta-sigma modulated version of $M_f(t)$ as would be measured if there was no load current. The second bit stream is schematically represented by FIG. 10b.

We will also assume that the first and second bit streams have been brought into temporal alignment such that a third bit stream can be formed representing a difference between the first and second bit streams. In this example the difference is formed by subtracting the second bit stream (FIG. 10b) from the first bit stream (FIG. 10a) to arrive at the third bit stream as shown in FIG. 10c.

There are four conditions that need to be handled, these are

1−1=0

1−0=1

0−1=−1

0−0=0

It can therefore be seen that the output bit stream can take any one of three values, 1, 0, −1.

Nevertheless, it can now be seen that this higher rate three level stream (where each bit can be represented by a sign bit and a magnitude bit) can now be processed by circuits expecting to work directly on the bit stream from the sigma-delta modulator.

Furthermore, since the sigma-delta modulator output is a pulse density encoded signal, this can be exploited, if desired, to convert the third bit stream back to a binary bit stream. Thus, in this example, every occurrence of '−1' bit could be latched and when a next "1" is encountered, it can be replaced by a '0' and then the latch holding the occurrence of the "−1" can be cleared. In effect each '−1' is offset against a '1' and both bits in the pairing are set to '0'. It is thus possible to remove the perturbation signal from the first bit stream with very little latency.

However, better techniques for bit stream processing can be invoked. Firstly it is important to note that each individual bit stream encodes a short term temporal average value of the signal that it represents. In the context of AC signals the average is a constantly changing value, but the upshot is that providing the bit streams are sufficiently time aligned compared to the signal that they are encoding, then bit stream processing will work. Putting this in the context of FIGS. 10a and 10b, if the mains borne current signal is at 50 Hz and the bit stream is at 1 MHz, then the 20 samples shown in FIG. 10a represents one thousandth of a mains cycle. If the perturbation is also in the frequency range of 30 to 300 Hz, then FIG. 10b also represents a very small portion of the perturbation signal. If the bits of 10b were moved one, several or even tens of bit positions with respect to the bits shown in FIG. 10a then although the pattern shown in FIG. 10c would look different, the averaging value of the bit stream of FIG. 10c over a relatively short time (which contained tens or hundreds of bits) would not change significantly.

This means that if we take two bit streams, and perform a simple operation on them such as addition, then we get a bit word as an output representing the decimal values 0, 1 and 2. Similarly if we chose to subtract two bit streams then we get a signal word representing the values 0, 1 and −1. We can then reconvert this sequence of two bit words (which look just like the pulse code modulated signal that one gets out of, for example, a multibit successive approximation routine converter) to a bit stream representation by using a digital modulator.

Figure 11:
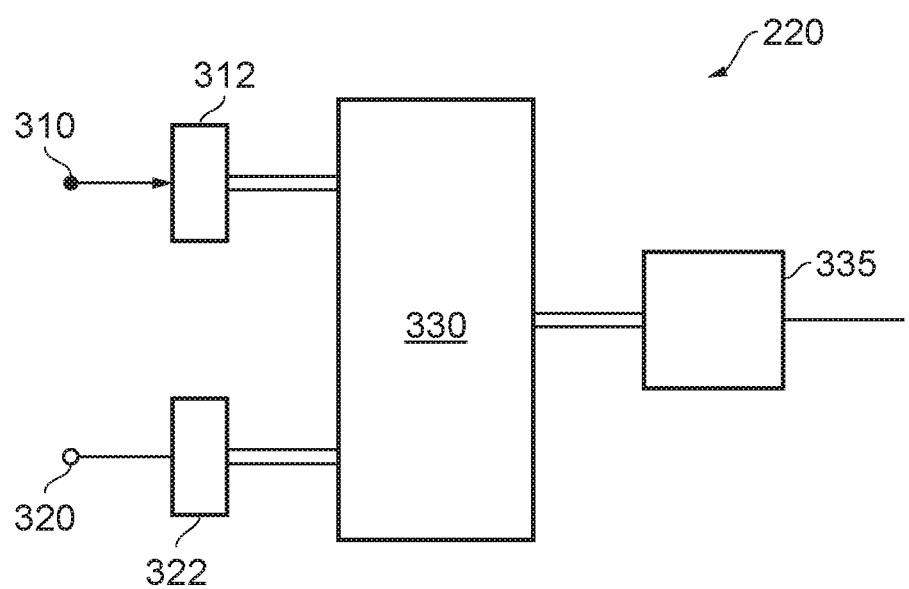
FIG. 11 shows an example of a bit stream processing circuit.

For generality, FIG. 11 shows a bit stream processing circuit 220 having a first input node 310 for receiving a first bit stream and a second input node 320 for receiving a second bit stream. Each node is optionally connected to a width expander 312 and 322 (also referred to as a manifold) that can convert the bit stream into an N bit wide word at the bit stream clock rate.

Figure 12:
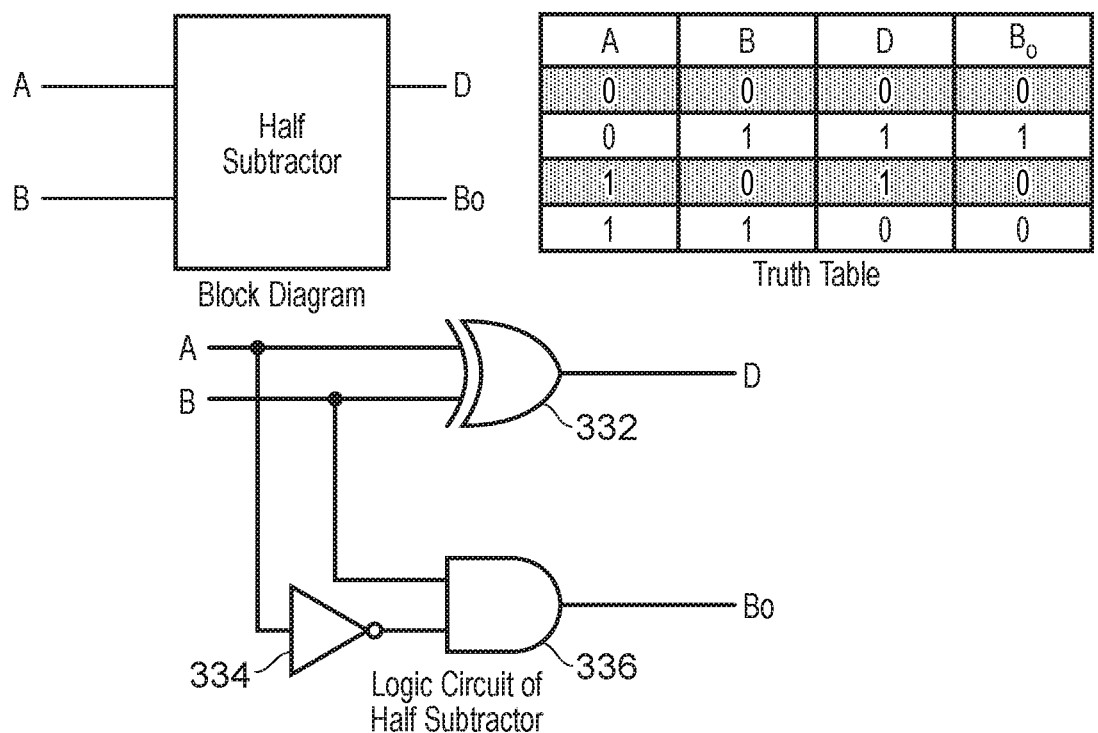
FIG. 12 shows an embodiment of a single bit subtractor.

The expanders 312 and 322 provide the data words of sufficient width (for a desired signal quality) to a digital signal processor 330, which in this example can be as simple as a 1-bit half subtractor but may be a wider (e.g. 2, 3 or more bits) subtractor. A one bit subtractor is shown in FIG. 12. As can be seen the half subtractor uses an XOR gate 332 to indicate when the inputs A and B are different from each other. An inverter 332 and an AND gate 336 generate a "borrow" signal, which in this example can act as a sign bit.

Figure 13A:
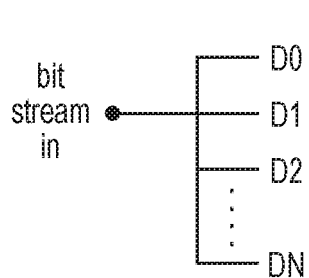
FIGS. 13a and 13b show embodiments of circuits for increasing the width of bit streams into multibit words.
Figure 13B:
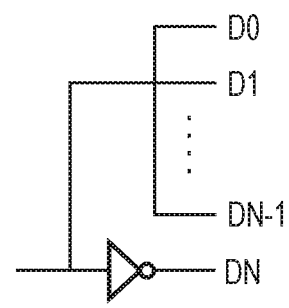

Should higher resolution be required FIGS. 13a and 13b show width expander circuits for converting the bit stream into an N bit wide word. FIG. 13a provides an unsigned word conversion (outputs=0 and $2^{(N+1)}-1$) and FIG. 13b shows a conversion circuit that outputs a signed word (outputs=$\pm 2^{N}-1$).

In this example where we only need a 1 bit half subtractor as the signal processor 330 then the width expanders 312 and 322 can be omitted.

Returning to FIG. 11, the output of the digital signal processor 330 is converted back into a signal bit stream (in this example) by a digital modulator 335.

The digital modulator can be formed using a delta-sigma modulator circuit, but adapted for use wholly in the digital domain.

Figure 14:
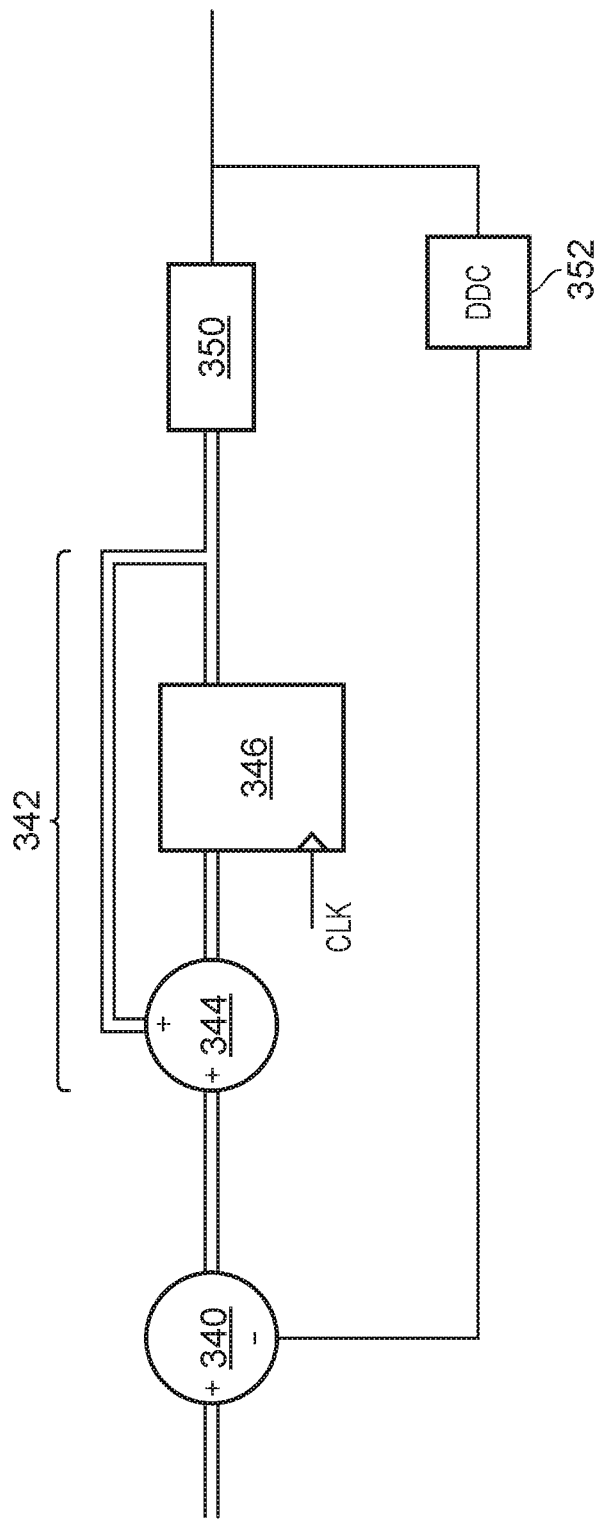
FIG. 14 shows a single stage delta-sigma modulator.

A single stage delta-sigma modulator is shown in FIG. 14. Here a digital subtractor 340 accepts an input word at its + (adding) input. An output of the digital subtractor is supplied to a digital integrator 342 formed around a multibit adder 344 and a multibit latch 346.

The output of the integrator 342 is provided to a comparator 350. The comparator could, for example merely examine the most significant bit of the word from the integrator, and every time the most significant bit is set (or some other threshold value reached) a '1' is output from comparator 350. Thus output signal forms a bit stream, and is also provided to a buffer or a digital to digital converter 352 to output a digital word which is provided to the subtracting input of the subtractor 340. Thus if the comparator outputs a '1' a predetermined value is subtracted from the input signal. If the comparator outputs a '0' then the predetermined value is added to the input signal. The value for addition or subtraction can be generated by a digital converter 352 (which may be a digital down converter, DDC).

The subtractor 340 and the adder 344 can both be implemented using a signal adder or other suitable hardware, or be implemented in a programmable data processor.

Figure 15:
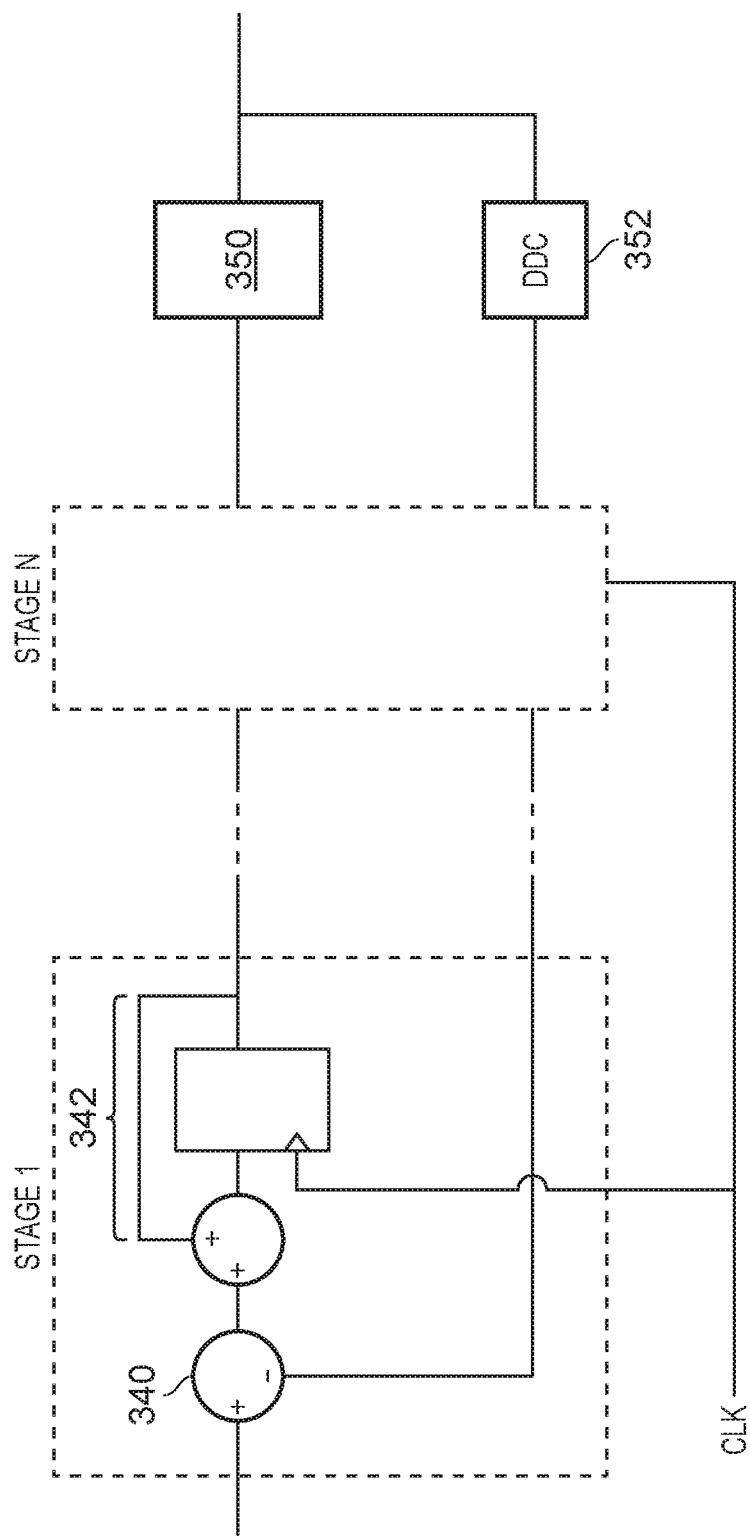
FIG. 15 shows a multi-stage delta-sigma modulator.

A first order modulator introduces noise to the bit stream. This noise can be reshaped by using higher order modulators such that less of the noise falls in a bandwidth of interest. Higher order delta-sigma modulators cascade multiple stages, each stage formed of a subtractor 340 and integrator 342 as shown in FIG. 15. Such higher order modulators are usable.

The approach described herein can also be applied to voltage measuring circuits using potential dividers.

Figure 16:
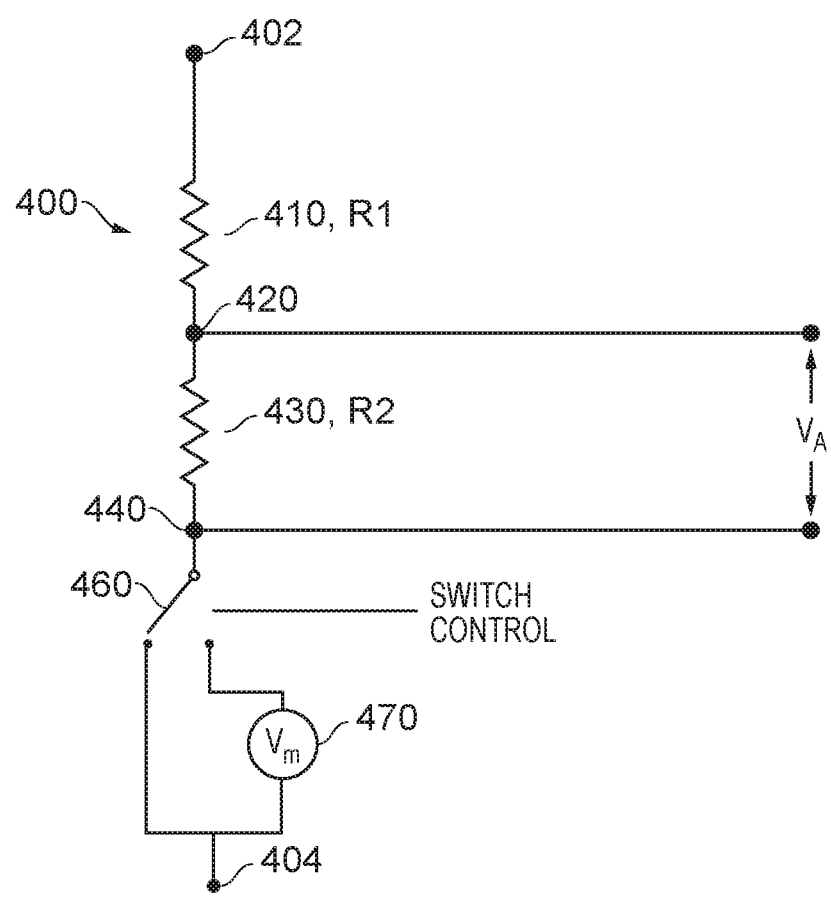
FIG. 16 shows a circuit for adding a perturbation signal $M_V(t)$ to a potential divider.

FIG. 16 is a schematic diagram of a voltage attenuator, generally labelled 400, which can measure the voltage difference between first and second input nodes 402 and 404, respectively. The attenuator comprises a first resistor 410 connected between the first input node 402 and a node 420. A second resistor 430 is connected between the node 420 and a further node 440. A switch 460 is provided such that the node 440 can be directly connected to the second input node 404, or to the node 404 by way of a voltage generator 470, depending on the state of a switch 460. The voltage VA between nodes 420 and 440 represents an output of the attenuator 400.

Node 402 may be connected to the live conductor 12 and node 404 may be connected to the neutral conductor 14, or an earthed node. Alternatively node 402 may be connected to the neutral conductor 14 and node 404 can be connected to the live conductor 12.

Suppose, for simplicity, that the first resistor 418 has a value R1, and the second resistor 430 has a value R2. Suppose also that the voltages at nodes 402 and 404 are V402 and V404 respectively.

We can write Vin as $|V_{402}-V_{404}|$

It can be seen that when the switch 460 is operative to connect second resistor 430 directly to the second node 404, then the voltage VA is given by:

$$V_A = V_{in} \frac{R2}{(R1+R2)}$$

When switch 460 is operative to connect the second resistor 430 to the measurement voltage source 470 outputting voltage $V_M$ with respect to $V_{404}$ then it becomes apparent that $$V_A = (V_{in} - V_M) \times \left(\frac{R2}{R1+R2}\right)$$

Looking at the latter equation, it is apparent that a variable voltage due to the application of the measurement signal occurs at VA represented by $$V_M \times \frac{R2}{R1+R2}$$

Thus the measurement voltage $V_M$ is attenuated by the attenuator in exactly the same way as the input signal is. Thus looking for changes in the output voltage VA which are correlated with changes in the voltage $V_M$, i.e. correlated with transitions of the switch 460, enables the attenuation ratio of the attenuator 400 to be measured.

$V_M$ may be provided as a square wave like waveform, for example by operation of the switch 460, although the transitions between the two states of the square wave waveform need not be instantaneous nor take the same duration.

Figure 17:
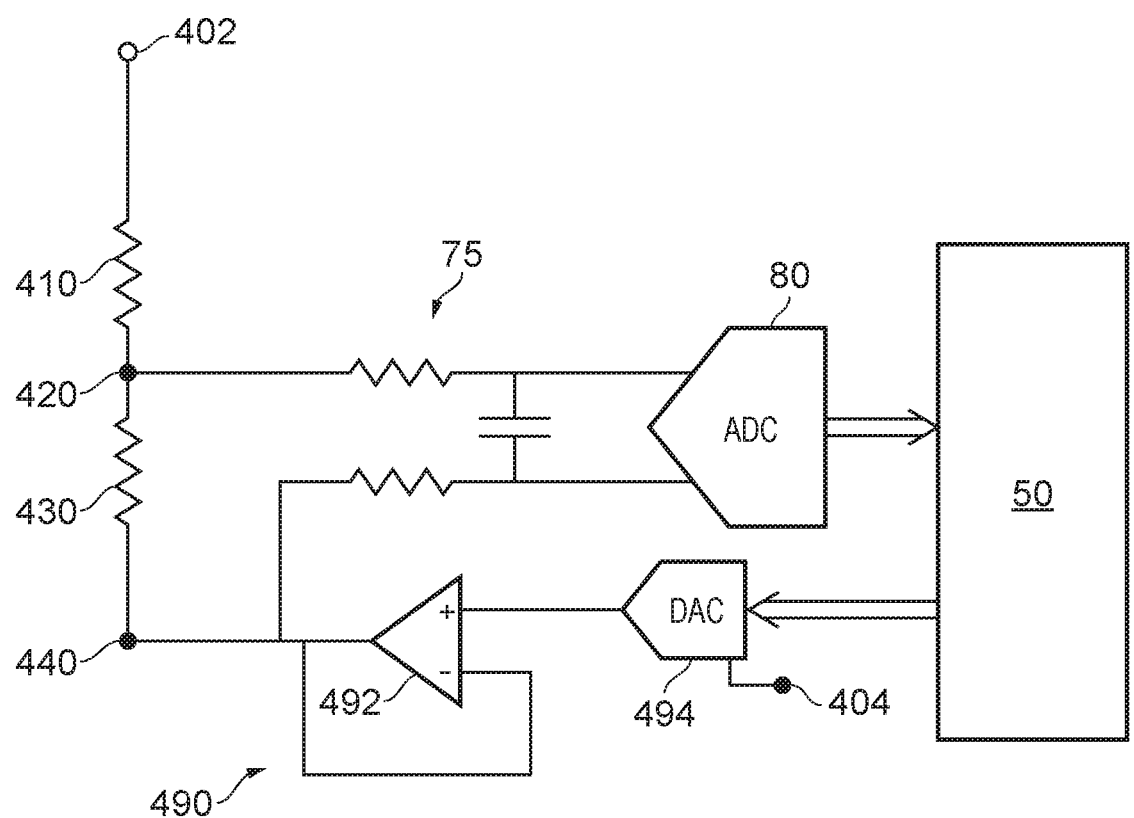
FIG. 17 shows a further embodiment of a circuit for adding a perturbation signal to a potential divider.

FIG. 17 shows an alternative implementation of the arrangement shown in FIG. 16. Specifically the connection to the switch 460 has been replaced by a connection to a voltage follower 490 comprising an operational amplifier 492, where a non-inverting input of the operational amplifier is connected to a digital to analog converter 494 which is driven to provide the time varying input signal $M_V(t)$. The voltage across the resistor 430 is measured by a differential analog to digital converter 80 associated with an anti-aliasing filter 75. The performance of the ADC 80 and the DAC 494 can be well matched if the circuits are provided on an integrated circuit, such that the output voltage from the DAC is accurate compared to the digital code provided to it by the data processor 50. The data processor 50 can drive the DAC 494 to output a test waveform, be that a sinusoid, a square wave, a piecewise approximation to a square wave or some other arbitrary waveform at a specified frequency, and the digitized signal provided by the ADC 80 can be used to look for the test waveform and extract it in order to determine the transfer ratio of the attenuator and associated signal processing circuits.

Figure 18:
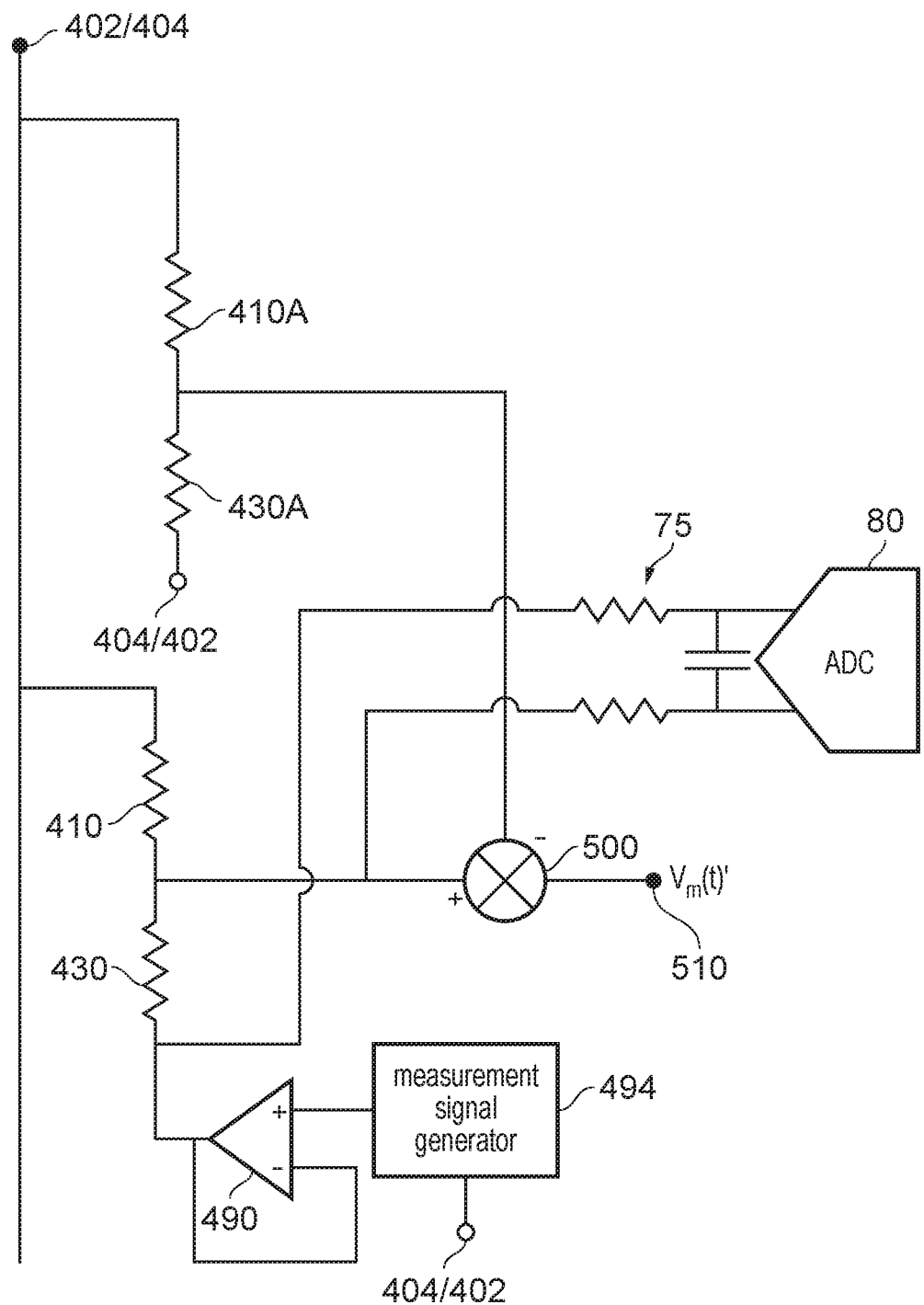
FIG. 18 shows how use of a further analog channel can help in estimating to contribution of the perturbation voltage $V_m$.

The magnitude of the voltage $M_V(t)$ is much smaller than the magnitude of the supply voltage $V_{in}$ that we wish to measure, and both are attenuated by the same amount. Therefore the measured voltage signal can swamp the magnitude of the voltage measurement signal used to characterize the operation of the attenuator. Whilst the use of an oversampled delta-sigma converter helps in being able to encode the change in signal levels introduced by the perturbing measurement signal, other steps can be taken to improve its identification. The voltage measurement signal can be extracted from the signal output from the attenuator by, for example, using locking amplifier techniques or filtering. Additionally, as shown in FIG. 18, a further measurement of the supply voltage might be made by a second voltage attenuator comprising resistors 410a and 430a which is substantially matched to the first one formed by resistors 410 and 430, but with the voltage at the lower node of the resistor 430a being held constant. It follows that if the output from this attenuator, where the measurement signal is not present, is subtracted from the output of the first voltage attenuator where the output thereof comprises both the mains voltage signal and the voltage measurement signal by a subtractor 500, then the result of the subtraction should leave the voltage measurement signal $M_V(t)'$ with substantially no contribution or interference from the supply voltage at node 510. This approach, which could be done in the analog domain, enables the magnitude of the attenuated signal $M_V(t)'$ resulting from $M_V(t)$ to be compared with the signal $M_V(t)$ more accurately, and thereby to establish the transfer function of the attenuator more accurately.

The voltage attenuators could be formed using capacitors rather than resistors.

Figure 19:
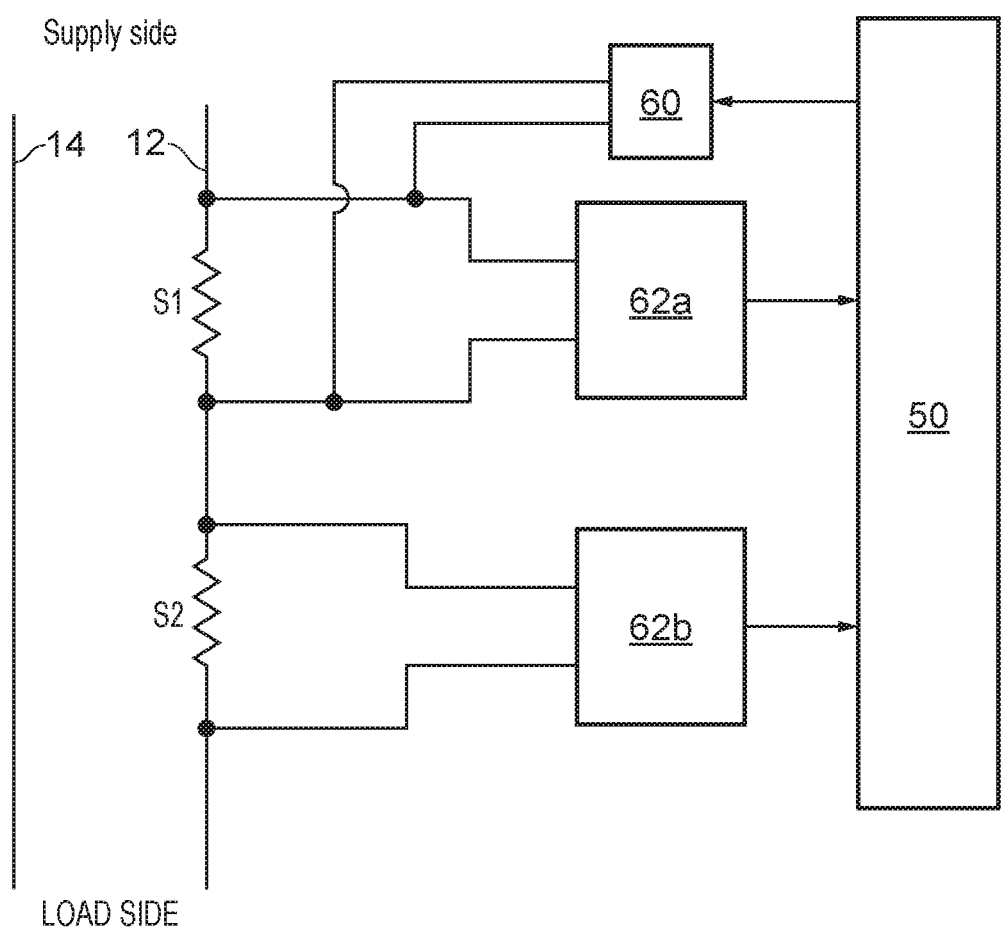
FIG. 19 shows a further embodiment where use of a second current sensor improves the estimate of the properties of the perturbation signal.

Similarly, an estimate of load current may be formed and then subtracted from a copy of the signal developed across the shunt resistor, thereby leaving the measurement signal, together with any residual part of the load current signal, for presentation to a data processing circuit used to determine the transfer function of the shunt resistor. Such an arrangement is shown in greater detail in FIG. 19. Here, two shunt resistors labelled S1 and S2 are provided. For convenience they are shown as being in series in the live conductor 12. However, as long as no earth leakage occurs it can be expected that the flow of current conductor 12 is matched by the current conductor 14 then the shunts S1 and S2 could be provided one in the live conductor and one in the neutral conductor, or less likely, both in the neutral conductor. The shunts S1 and S2 need not be fabricated to have the same value as the relative sizes of the signals derived from the shunts may be scaled by a variable gain amplifier and/or a variable attenuator such that they match each other. However for convenience they can be expected to have the same nominal value. If S1 and S2 are provided in different conductors then additional isolation may be required. Alternatively one of the shunts can be replaced by an inductive sensor such that isolation is achieved by the use of a non-contacting sensor.

The voltage across the first shunt S1 is measured by a first voltage measuring circuit 62a. The voltage across the shunt S2 is measured by a further voltage measuring circuit 62b which is nominally identical to the circuit 62a. Indeed, a single circuit 62 may be used in a time multiplexed manner if so desired. In the arrangement shown in FIG. 19 a measurement current generator 60 is provided and arranged to provide a measurement current solely to shunt S1.

It can therefore be seen that the voltage across S2 is proportional to the load current whereas the voltage across shunt S1 is proportional to the sum of the load current and the measurement current. Thus the load current is common to both of these measurements. It therefore follows that subtracting the voltage across S2 from the voltage across S1 should in theory lead to voltage which only contains the measurement current contribution. Thus the voltage across S1 resulting from the measurement current can be determined with greater accuracy and given that the measurement current $I_M$ is specified, then the transfer function of S1 can be determined with greater accuracy, as that the load current signal, which effectively acts as noise when determining the transfer function of S1, is now removed or suppressed from this operation.

Figure 20:
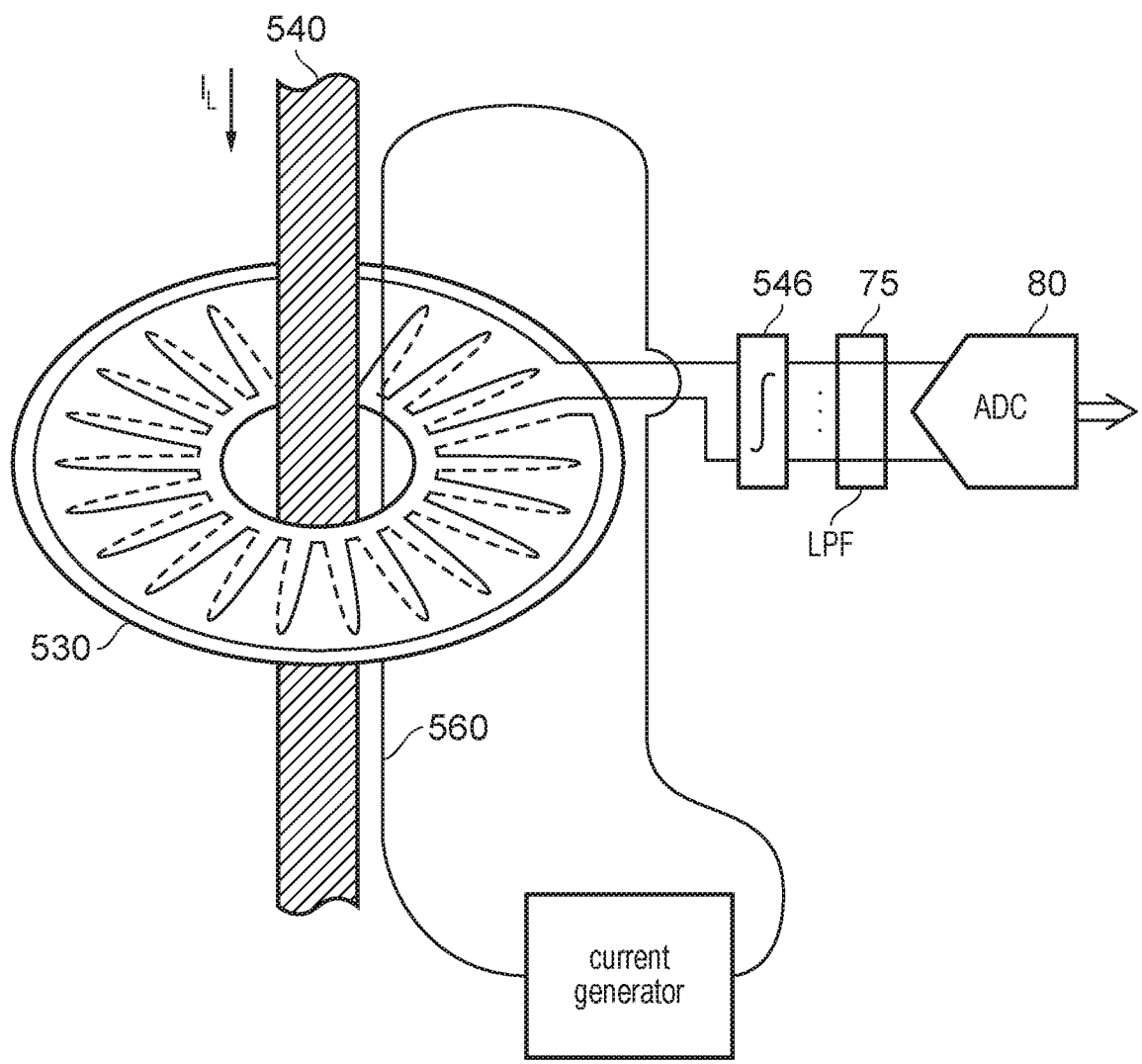
FIG. 20 shows an embodiment of a current sensor using an inductive transducer.

So far the circuits have been described with respect to a shunt sensor. Just for completeness FIG. 20 shows an inductive sensor, in this case a Rogowski coil 530 formed around a current carrying conductor 540, the formation and operation of Rogowski coils are available and need not be described further here. In FIG. 20 the Rogowski coil has been formed by conductors on either side of a planar substrate. Conductors on the upper side are shown by solid lines whereas conductors on the lower side are shown by broken lines. Vias exist in the substrate to connect the upper conductors to the lower conductors at various connection points in order to form the helical path of a coil advancing around the current carrying conductor. The outputs of the Rogowski coil 530 are connected to an integrator 546 in order to convert the response of the Rogowski coil from one which is proportional to frequency to a substantially frequency independent response. The output of the integrator can be filtered by a low pass filter 75 to provide an anti-aliasing function, and then digitized by an analog to digital converter 80. When the measurement current $I_M$ is caused to flow in an additional conductor 560, the output from the Rogowski coil 530 is modified to represent the sum of the load current and the measurement current. The measurement current can be made bipolar (flowing in either direction) in order to increase the effective change in the ADC output resulting from the present of the measurement current. Alternatively the measurement current can be made to flow in the current carrying conductor.

The current flowing in the additional conductor 560 can be provided by a current source, for example by a circuit similar to that described with respect to FIG. 7. The current flowing in the additional conductor can either be well defined by a suitable current generating circuit providing a specified, and possibly calibrated current, or equally a less well controlled current generator could be used, and the current that it provides can be measured. In either event knowledge of the measurement current and the response of the sensor allows the transfer function to be estimated.

A single current source/generator can be used in a multiphase supply, and can be time multiplexed to the individual phases, or where an additional wire 560 is used, the wire can pass through each current sensor.

The arrangement shown in FIG. 20 works equally well when the current sensor is a current transformer. The output of the transformer is loaded by a burden resistor, and the integrator 546 is omitted.

Figure 10:
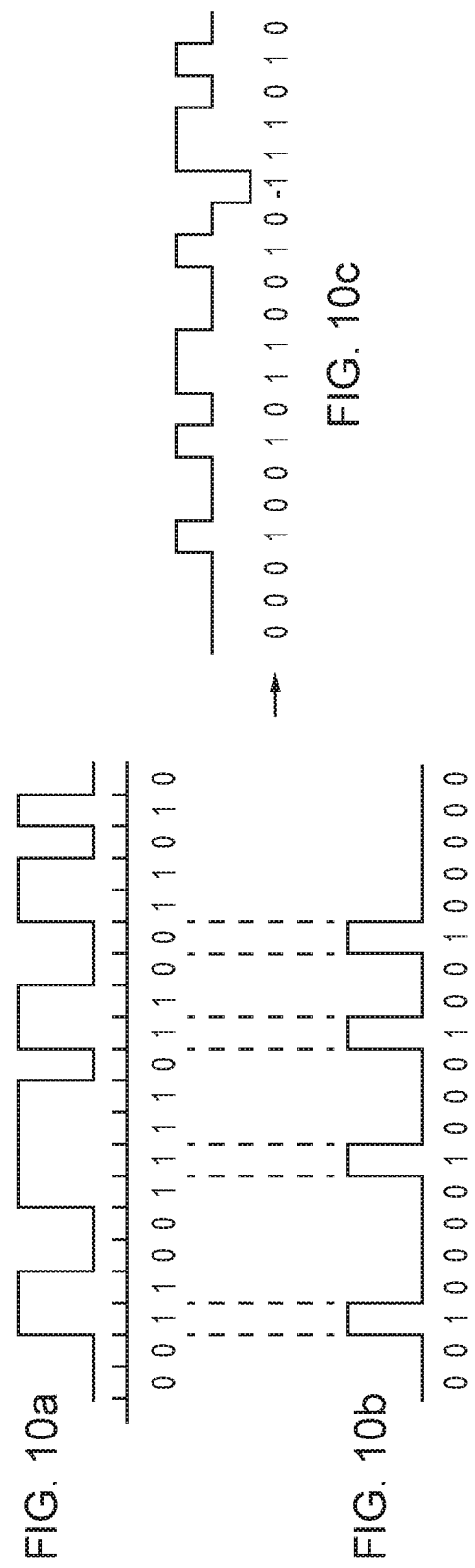
FIG. 10A-C shows in diagrammatic form the signal processing operation performed on the bit stream output by the sigma delta modulator forming the analog to digital converter shown in FIG. 7.
Figure 21:
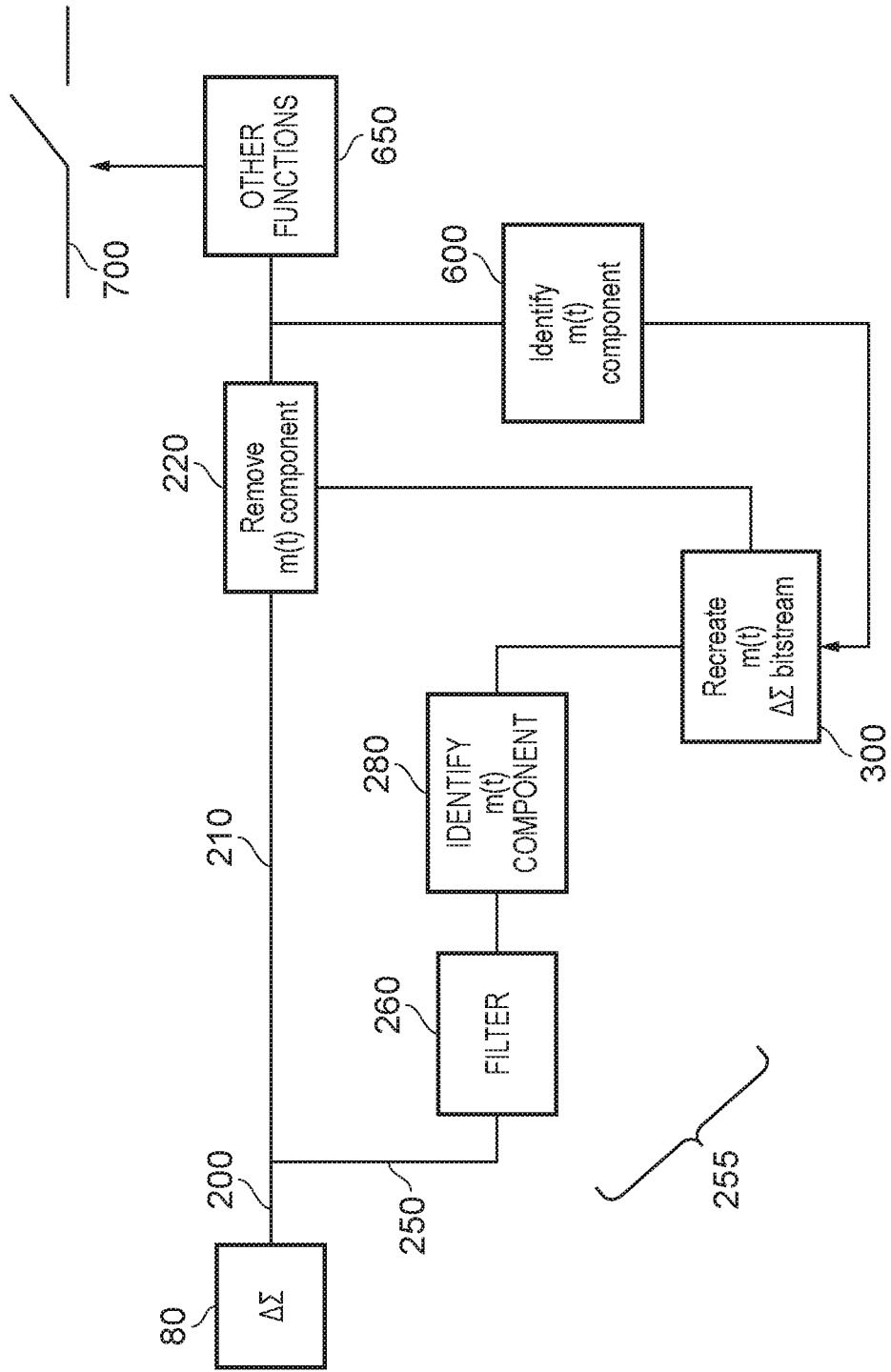
FIG. 21 shows a modified circuit for testing that the subtraction of the perturbation signal has worked, and for modifying the generation of the second bit stream.

The discussion of operation of the system with respect to FIGS. 9 and 10 assumed that the second bit stream representing the perturbation signal had been correctly identified and time aligned with the first bit stream. This can be tested, as shown in FIG. 21, by adding a further processor 600 arranged to monitor the output from the subtractor 220 to look for components representative of the perturbation signal. If the perturbation signal has been removed correctly there should be none left, but magnitude errors or temporal misalignment could result in the subtraction being less efficient than expected. Therefore any residual component of the perturbation signal at the output of the subtractor can be monitored and used to modify the recreated bit stream formed by the bit stream recreator 300 so as to shift the bit stream in order to minimize the existence of the residual component.

The circuit 600 can include a filter to convert the bit stream to a low data rate wide digital word. This can then be filtered to extract information about any residual perturbation signal and coefficients for the bit-stream recreator updated, in a process that is analogous to that used in signal predistortion in amplifiers.

The circuit 600 can run in conjunction with the circuit 255 or may be used as an alternative to the circuit 255.

In any event, the bit stream recreator is given parameters that it can store such that right from circuit startup it can output a second bit stream synchronized with the operation of the perturbation generator to enable an estimate of the contribution of the perturbation signal to the first bit stream to be removed without delay.

The description has focused on subtracting the second bit stream from the first one. However if the second bit stream is replaced by signed (i.e. +Ve and −Ve) digital words at the bit stream rate then a negated version of the perturbation signal can be provided, and the operation performed by the digital processor 220 to remove the perturbation signal becomes an addition at the bit stream rate.

It also follows that this technique can be extended to remove one or more periodic or deterministic interferers from the bit stream provided that they can be predicted to a desired degree of accuracy.

The signal output by the subtractor 220 can then be processed by a further processing block 650 implementing other functions, such as over current detection, which can be used to control a circuit breaker 700 to make or break a current flow path.

Figure 22:
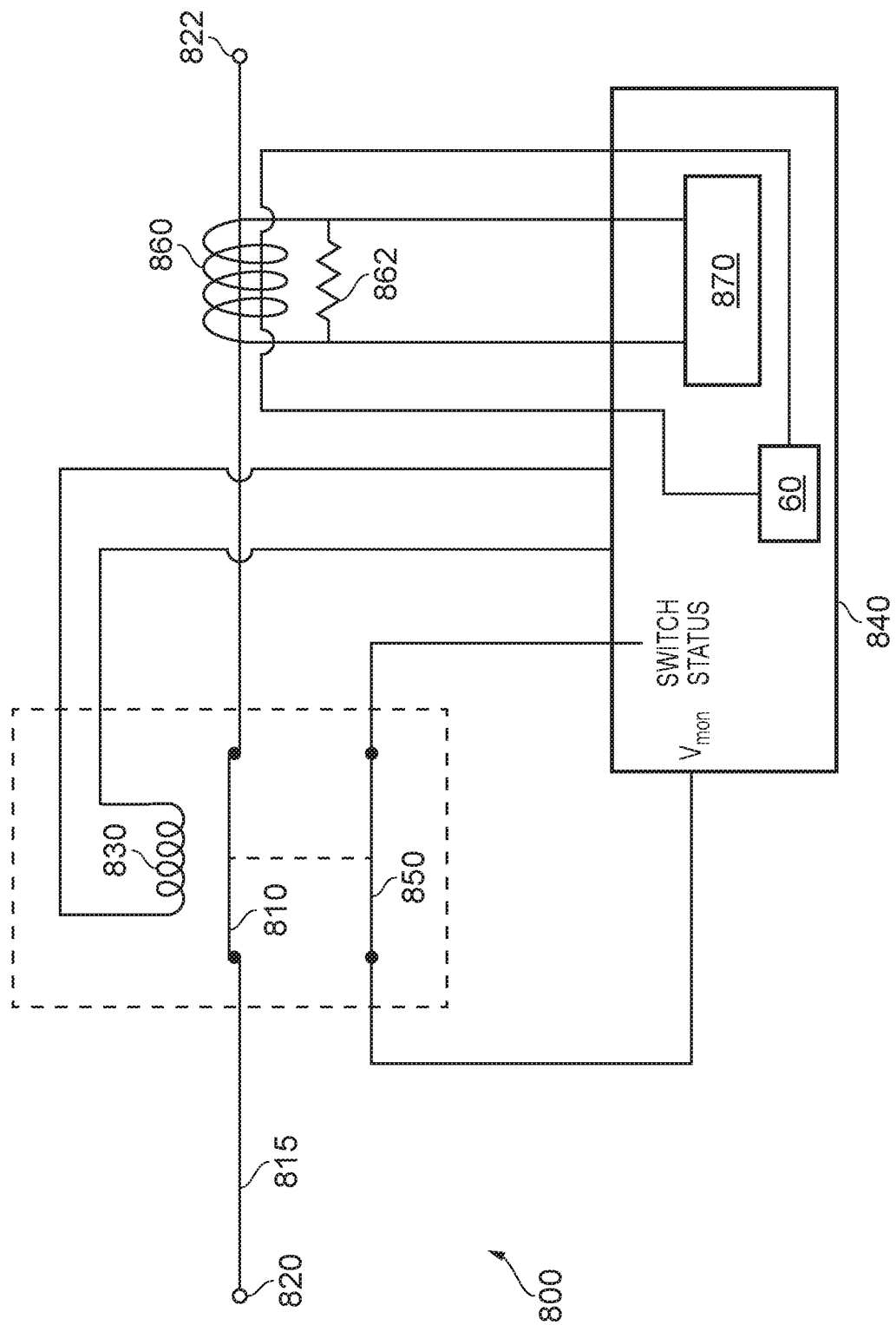
FIG. 22 shows a protection circuit constituting an embodiment of the present disclosure.

FIG. 22 shows, for completeness, a protection device 800 comprising an electro-mechanical switch 810 acting as a circuit breaker to interrupt current flow along a conductor 815 between nodes 820 and 822 which represent arbitrary points in an electricity distribution system. The electromechanical switch 810 is activated by energizing a coil 830 by a controller 840. The switch carries a ganged contractor 850 which confirms the status of the switch 810 to the controller 840. A current transformer 860 and associated burden resistor 862 measure the current in the conductor. The current transformer 860 is connected to a measurement circuit 870 constituting an embodiment of the present invention, for example by including the structures described with respect to FIG. 9 or 21 and FIG. 7.

It is thus possible to provide a system which can monitor the performance of a current detector or voltage attenuator to confirm that its transfer characteristic is not degraded, whilst being able to remove the monitoring signal quickly from the output of an analog to digital converter such that safety critical functions, which may be provided by other items of equipment and possibly by other manufacturers, can be agnostic as to the presence of the perturbation signal.

Where an isolation barrier is provided, it is not constrained to being placed after the third bit stream has been formed. An isolation barrier could be placed at the output of the ADC 80.

The claims presented here are in single dependency format suitable for filing at the USPTO, but it is to be understood that any claim can be dependent on any one or more preceding claims unless that is clearly technically impossible.

The invention claimed is:

1. An apparatus for removing a specified perturbation signal from a first bit stream where the first bit stream comprises the specified perturbation signal and a measurand, wherein the specified perturbation signal is a specified value corresponding to characterization of a transfer function describing a system, and where the first bit stream is provided at a first bit rate, the apparatus comprising:
   a perturbation signal processor adapted to identify the specified perturbation signal and to form a representation of the specified perturbation signal where the representation is formed at the first bit rate; and
   a digital processor adapted to receive the first bit stream and the representation of the specified perturbation signal and to form an output stream as a function of the first bit stream and the representation of the specified perturbation signal.

2. An apparatus as claimed in claim 1, in which the perturbation signal processor is configured to act on the first bit stream to identify the specified perturbation signal.

3. An apparatus as claimed in claim 1 in which the perturbation signal processor comprises a first converter adapted to transform the first bit stream into multibit digital words.

4. An apparatus as claimed in claim 1, in which the representation of the specified perturbation signal is converted to a second bit stream at the first bit rate.

5. An apparatus as claimed in claim 4, in which the digital processor is adapted to form a difference between the first bit stream and the second bit stream.

6. An apparatus as claimed in claim 1, in which the specified perturbation signal is adapted to form a negated version of the specified perturbation signal in a sequence of digital words at the first bit rate, and the digital processor adds the digital words to the first bit stream.

7. An apparatus as claimed in claim 1, in which the digital processor further comprises a digital modulator to create the output bit stream.

8. An apparatus as claimed in claim 1, further comprising first and second data paths from an input node that receives the first bit stream, the first data path connecting to a first input of the digital processor, and the second data path comprising the perturbation signal processor.

9. An apparatus as claimed in claim 1, in which the perturbation signal processor is provided with information of a frequency of the specified perturbation signal and uses this to identify a phase shift and magnitude of a component in the first bit stream that is attributable to the specified perturbation signal.

10. An apparatus as claimed in claim 1 further comprising a further perturbation signal processor monitoring an output of the digital processor to adjust the representation of the specified perturbation signal.

11. An apparatus as claimed in claim 1, where the perturbation signal processor receives the output bit stream as an input.

12. An apparatus as claimed in claim 1, included in at least one of a current monitoring system or a voltage monitoring system.

13. An apparatus as claimed in claim 1, included in a protective system.

14. A method of removing a perturbation signal from a first bit stream where the first bit stream represents a digital version of an analog signal which comprises a measurand and a specified perturbation corresponding to characterization of a transfer function describing a system applied to the measurand, the method comprising forming a second signal and processing the first bit stream and the second signal to create an output bit stream, where the second signal represents a digitized version of the specified perturbation.

15. A method as claimed in claim 14, where the second signal is a second bit stream generated so as to be phase shifted with respect to the specified perturbation.

16. A method as claimed in claim 14, further including examining the first bit stream to update parameters used to form the second bit stream.

17. A method as claimed in claim 14, further including examining the output bit stream to update parameters used to form the second bit stream.

18. A method as claimed in claim 14, further including down-converting the first bit stream from a low width high data rate digital signal to a larger width lower data rate sequence of words, and analyzing the words to identify a contribution of the specified perturbation signal.

19. A protective device for monitoring excursions of a measurand beyond acceptable limits, said device including a transducer for converting the measurand into an input signal, a processor for processing the input signal and an electrically controlled switch responsive to the processor;
   where the processor includes a specified perturbation generator for adding a specified perturbation signal to the measurand, said specified perturbation signal being specified such that monitoring of a signal component in the input signal resulting from the specified perturbation signal enables a transfer function of the transducer to be monitored, the processor further generating a representation of the specified perturbation signal to be subtracted from the input signal,
   wherein the input signal is converted to a digital domain by a sigma-delta modulator to provide a first digital signal and the representation of the specified perturbation signal using a low pass filter is combined with the first digital signal to produce a further digital signal in which a contribution of the specified perturbation signal is reduced.

20. A device as claimed in claim 19, in which the first digital signal is a pulse density modulated signal, and the representation of the specified perturbation signal is a second pulse density modulated signal, and a subtractor forms a third pulse density modulated signal as a difference between the first and second pulse density modulated signals.

* * * * *

UNITED STATES PATENT AND TRADEMARK OFFICE
CERTIFICATE OF CORRECTION

| | |
|---|---|
| PATENT NO. | : 11,474,131 B2 |
| APPLICATION NO. | : 16/569361 |
| DATED | : October 18, 2022 |
| INVENTOR(S) | : Wang et al. |

It is certified that error appears in the above-identified patent and that said Letters Patent is hereby corrected as shown below:

On the Title Page

Add item (30), as follows:
--(30) Foreign Application Priority Data
Sep. 21, 2018 (CN) PCT/CN2018/107082--

In the Claims

In Column 17, Line 26, in Claim 3, delete "muitibit" and insert --multibit-- therefor Signed and Sealed this
Twenty-fourth Day of September, 2024

Katherine Kelly Vidal
*Director of the United States Patent and Trademark Office*